United States Patent
Wang et al.

(10) Patent No.: US 12,057,455 B2
(45) Date of Patent: Aug. 6, 2024

(54) DRIVING BACKPLANE AND METHOD OF MANUFACTURING THE SAME, AND DISPLAY APPARATUS

(71) Applicants: Chongqing BOE Display Technology Co., Ltd., Chongqing (CN); BOE TECHNOLOGY GROUP CO., LTD., Beijing (CN)

(72) Inventors: Wentao Wang, Beijing (CN); Dawei Shi, Beijing (CN); Pei Wang, Beijing (CN); Dongsheng Zhao, Beijing (CN); Lu Yang, Beijing (CN); Liang Huo, Beijing (CN); Cenhong Duan, Beijing (CN); Can Huang, Beijing (CN); Xiaosong Wen, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 449 days.

(21) Appl. No.: 17/621,176

(22) PCT Filed: Dec. 18, 2020

(86) PCT No.: PCT/CN2020/137722
§ 371 (c)(1),
(2) Date: Dec. 20, 2021

(87) PCT Pub. No.: WO2022/126638
PCT Pub. Date: Jun. 23, 2022

(65) Prior Publication Data
US 2022/0399379 A1    Dec. 15, 2022

(51) Int. Cl.
*H01L 27/12* (2006.01)
*G09G 3/3233* (2016.01)

(52) U.S. Cl.
CPC ....... *H01L 27/1244* (2013.01); *G09G 3/3233* (2013.01); *H01L 27/1259* (2013.01);
(Continued)

(58) Field of Classification Search
CPC ............. H01L 27/1244; H01L 27/1259; H01L 27/124; G09G 3/3233; G09G 2300/0408;
(Continued)

(56) References Cited

U.S. PATENT DOCUMENTS

2017/0271368 A1   9/2017   Zhang et al.
2018/0284507 A1   10/2018  Xu et al.
(Continued)

FOREIGN PATENT DOCUMENTS

CN    104536610 A    4/2015
CN    105575961 A    5/2016
(Continued)

*Primary Examiner* — David A Zarneke
(74) *Attorney, Agent, or Firm* — IP & T GROUP LLP

(57) ABSTRACT

A driving backplane includes: a base; a first conductive layer disposed on the base, the first conductive layer including at least one first signal line; a first insulating layer disposed on a side of the first conductive layer away from the base; a second conductive layer disposed on a side of the first insulating layer away from the first conductive layer, the second conductive layer including at least one second signal line. Each first signal line and a second signal line constitute a signal line pair. In the signal line pair, extending directions of the first signal line and the second signal line are the same, an orthogonal projection of the first signal line on the base and an orthogonal projection of the second signal line on the base have a first overlapping region, and the second signal line is coupled to the first signal line.

20 Claims, 12 Drawing Sheets

(52) U.S. Cl.
CPC .............. *G09G 2300/0408* (2013.01); *G09G 2300/0819* (2013.01); *G09G 2300/0842* (2013.01); *G09G 2320/0626* (2013.01); *G09G 2330/021* (2013.01)

(58) Field of Classification Search
CPC ... G09G 2300/0819; G09G 2300/0842; G09G 2300/0626; G09G 2300/0426; G09G 2300/0861
See application file for complete search history.

(56) References Cited

U.S. PATENT DOCUMENTS

| | | |
|---|---|---|
| 2019/0034012 A1 | 1/2019 | Xie et al. |
| 2021/0151525 A1 | 5/2021 | Li et al. |
| 2021/0181888 A1 | 6/2021 | Yan et al. |

FOREIGN PATENT DOCUMENTS

| | | |
|---|---|---|
| CN | 106468972 A | 3/2017 |
| CN | 106816457 A | 6/2017 |
| CN | 106935600 A | 7/2017 |
| CN | 107026177 A | 8/2017 |
| CN | 110095889 A | 8/2019 |
| CN | 110187797 A | 8/2019 |
| CN | 111491441 A | 8/2020 |
| CN | 111613648 A | 9/2020 |

DRIVING BACKPLANE AND METHOD OF MANUFACTURING THE SAME, AND DISPLAY APPARATUS

CROSS-REFERENCE TO RELATED APPLICATION

This application is a national phase entry under 35 USC 371 of International Patent Application No. PCT/CN2020/137722 filed on Dec. 18, 2020, which is incorporated herein by reference in its entirety.

TECHNICAL FIELD

The present disclosure relates to the field of display technologies, and in particular to a driving backplane and a method of manufacturing the same, and a display apparatus.

BACKGROUND

Display apparatuses have characteristics of lightness, thinness, power saving, and diversified application scenarios, and have broad application prospects.

There are various types of display apparatuses, which can be classified into liquid crystal display (LCD) apparatuses, inorganic electroluminescent display apparatuses, organic light-emitting diode (OLED) display apparatuses, field emission display (FED) apparatuses according to display media and operation principles. Each type of display apparatuses may be applied to a variety of scenarios, so as to meet different image display requirements.

SUMMARY

In an aspect, a driving backplane is provided. The driving backplane includes a base, a first conductive layer disposed on the base, a first insulating layer disposed on a side of the first conductive layer away from the base, and a second conductive layer disposed on a side of the first insulating layer away from the first conductive layer. The first conductive layer includes at least one first signal line, and the second conductive layer includes at least one second signal line. Each first signal line and a respective one of the at least one second signal line constitute a signal line pair. In the signal line pair, an extending direction of the first signal line is the same as an extending direction of the second signal line, an orthogonal projection of the first signal line on the base and an orthogonal projection of the second signal line on the base have a first overlapping region, and the second signal line is coupled to the first signal line.

In some embodiments, the driving backplane further includes a second insulating layer disposed on a side of the second conductive layer away from the base, and a third conductive layer disposed on a side of the second insulating layer away from the base. The third conductive layer includes at least one first conductive pattern. Each first conductive pattern extends through the second insulating layer to be coupled to a second signal line in a respective one of at least one signal line pair, and the first conductive pattern extends through the second insulating layer and the first insulating layer to be coupled to a first signal line in a same signal line pair as the second signal line.

In some embodiments, the first insulating layer has at least one first via hole, and the second insulating layer has at least one second via hole. Each first via hole and a respective one of the at least one second via hole constitute a via hole pair, and the first via hole is communicated with the second via hole in the via hole pair. In the signal line pair, a portion of the first signal line exposed by a corresponding via hole pair is a first connection portion; a portion of the second signal line exposed by a second via hole in the corresponding via hole pair is a second connection portion. An orthogonal projection of the second connection portion on the base and the first overlapping region have a second overlapping region. A first conductive pattern is in contact with the second connection portion through the second via hole in the corresponding via hole pair, and is in contact with the first connection portion through the corresponding via hole pair.

In some embodiments, the first via hole has a first opening and a second opening opposite to each other, and the first opening is far away from the base compared to the second opening; the second via hole has a third opening and a fourth opening opposite to each other, and the third opening is far away from the base compared to the fourth opening. In a same via hole pair, a combination of an orthogonal projection of the first opening on the base and an orthogonal projection of the second connection portion exposed by the second via hole on the base substantially coincides with an orthogonal projection of the fourth opening on the base.

In some embodiments, an orthogonal projection of the corresponding via hole pair on the base is contained within a border of an orthogonal projection of the signal line pair on the base.

In some embodiments, in a same signal line pair, the first signal line is coupled to the second signal line through a plurality of via hole pairs, and the plurality of via hole pairs are arranged in the extending direction of the first signal line.

In some embodiments, an orthogonal projection of the via hole pair on the base is completely located within an orthogonal projection of the first conductive pattern on the base.

In some embodiments, a minimum distance between an edge of the orthogonal projection of the first conductive pattern on the base and an edge of the orthogonal projection of the via hole pair on the base is greater than or equal to one sixth of a width of the first signal line.

In some embodiments, a ratio of a width of the first overlapping region to a width of the first signal line is in a range of one third to one half in a width direction of the first signal line.

In some embodiments, the second conductive layer further includes at least one second conductive pattern. In a signal line pair adjacent to a second conductive pattern, the first signal line is closer to the second conductive pattern than the second signal line.

In some embodiments, the second conductive layer includes at least two second conductive patterns, and the at least two second conductive patterns include electrode plates and/or initialization signal lines.

In some embodiments, a width of the first signal line is equal to a width of the second signal line.

In some embodiments, the driving backplane further includes two driving circuits coupled to both ends of the at least one first signal line.

In some embodiments, the at least one first signal line includes at least one of a gate line, a light-emitting control signal line and a reset signal line.

In some embodiments, the driving backplane further includes an active pattern layer disposed on a side of the first conductive layer proximate to the base. The active pattern layer includes at least one semiconductor pattern and a plurality of conductorized patterns, and each semiconductor pattern spaces two conductorized patterns in the plurality of conductorized patterns apart.

In some embodiments, in a case where the driving backplane includes a third conductive layer, the third conductive layer further includes data lines and power supply voltage lines. An extending direction of the data lines is the same as an extending direction of the power supply voltage lines, and orthogonal projections of the data lines on the base and orthogonal projections of the power supply voltage lines on the base have no overlapping region.

In another aspect, a display apparatus is provided. The display apparatus includes the driving backplane as described in any of the above embodiments.

In yet another aspect, a method of manufacturing a driving backplane is provided, and the method includes: forming a first conductive layer on a base, and forming a first insulating layer and a second conductive layer in sequence on the base on which the first conductive layer has been formed. The first conductive layer includes at least one first signal line. The second conductive layer includes at least one second signal line. Each first signal line and a respective one of the at least one second signal line constitute a signal line pair. In the signal line pair, an extending direction of the first signal line is the same as an extending direction of the second signal line, an orthogonal projection of the first signal line on the base and an orthogonal projection of the second signal line on the base have a first overlapping region, and the second signal line is coupled to the first signal line.

In some embodiments, the method of manufacturing the driving backplane further includes: forming a second insulating layer on a side of the second conductive layer away from the base, and forming a third conductive layer on a side of the second insulating layer away from the base. The third conductive layer includes at least one first conductive pattern. The first insulating layer has at least one first via hole, the second insulating layer has at least one second via hole. Each first via hole and a respective one of the at least one second via hole constitute a via hole pair, and the first via hole is communicated with the second via hole in the via hole pair. In the signal line pair, a portion of the first signal line exposed by the corresponding via hole pair is a first connection portion; a portion of the second signal line exposed by a second via hole in the corresponding via hole pair is a second connection portion. An orthogonal projection of the second connection portion on the base and the first overlapping region have a second overlapping region. A first conductive pattern is in contact with the second connection portion through the second via hole in the corresponding via hole pair, and is in contact with the first connection portion through the corresponding via hole pair.

In some embodiments, steps of forming the first insulating layer, the second conductive layer and the second insulating layer include: forming a first insulating film on the base on which the first conductive layer has been formed, forming the second conductive layer on the base on which the first insulating film has been formed, forming a second insulating film on the base on which the second conductive layer has been formed, and patterning the second insulating film and the first insulating film to form the second insulating layer including the at least one second via hole and the first insulating layer including the at least one first via hole. The second conductive layer includes at least one second signal line.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, but are not limitations on actual sizes of products, actual processes of methods and actual timings of signals to which the embodiments of the present disclosure relate.

DETAILED DESCRIPTION

Figure 1:
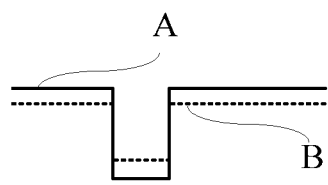
FIG. 1 is waveform diagrams of a voltage signal at a position A proximate to a signal source and the voltage signal at a position B far away from the signal source, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, terms such as "first" and "second" are used for descriptive purposes only, and are not to be construed as indicating or implying relative importance or implicitly indicating the number of indicated technical features. Thus, a feature defined by "first" or "second" may explicitly or implicitly include one or more of the features. In the description of the embodiments of the present disclosure, the term "a plurality of" or "the plurality of" means two or more unless otherwise specified.

In the description of some embodiments, the terms "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if it is detected" is optionally construed as "in a case where it is determined that" or "in response to determining that" or "in a case where detecting that" or "in response to detecting that", depending on the context.

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

As used herein, the term "about", "approximately" or "substantially" includes a stated value and an average value within an acceptable range of deviation of a particular value. The acceptable range of deviation is determined by a person of ordinary skill in the art in view of the measurement in question and the error associated with measurement of a particular amount (i.e., the limitations of the measurement system).

Exemplary embodiments are described herein with reference to cross-sectional views and/or plan views as idealized exemplary drawings. In the accompanying drawings, thicknesses of layers and sizes of regions are enlarged for clarity. Variations in shape with respect to the drawings due to, for example, manufacturing technologies and/or tolerances may be envisaged. Therefore, the exemplary embodiments should not be construed as being limited to the shapes of the regions shown herein, but including deviations in shape due to, for example, manufacturing. For example, an etched region shown in a rectangular shape generally has a curved feature. Therefore, regions shown in the accompanying drawings are schematic in nature, and their shapes are not intended to show actual shapes of the regions in a device, and are not intended to limit the scope of the exemplary embodiments.

A display apparatus includes a plurality of sub-pixels with different light-emitting colors. A driving backplane is mostly used for controlling light-emitting brightness of the sub-pixels to display a corresponding image. For example, the display apparatus is an active matrix organic light-emitting diode (AMOLED) display apparatus. With the development of display technology, the existing AMOLED display apparatus is no longer limited to a medium- and small-sized product such as a mobile phone, and an application range thereof is gradually expanded to a medium- and large-sized product such as a folding display apparatus, a notebook, and a vehicle-mounted display apparatus. However, for this kind of medium- and large-sized display apparatuses, as the size becomes larger, some signal lines become longer correspondingly, and in this case, a resistance of a signal line increases. During signal transmission, voltage values, at a position proximate to a signal source (i.e., a circuit that outputs the signal) and at a position far away from the signal source, of a signal in a signal line are different, resulting in a problem of uneven color (e.g., empurpling) in a signal transmission direction. Referring to FIG. 1, it will be seen that a voltage value of a voltage signal at position A, proximate to the signal source, in the signal line is not equal to a voltage value of the voltage signal at position B, far away from the signal source, in the signal line, and an absolute value of a difference between a maximum voltage and a minimum voltage of the voltage signal at the position A is less than an absolute value of a difference between a maximum voltage and a minimum voltage of the voltage signal at the position B. That is, in a process that the voltage signal is transmitted from the position A to the position B, signal attenuation occurs due to an influence of a surface resistance of the signal line, which has an adverse effect on a display effect.

In order to solve this problem, some embodiments of the present disclosure provide a display apparatus. For example, the display apparatus may be a display, a television, a billboard, a digital photo frame, a laser printer with a display function, a telephone, a mobile phone, a personal digital assistant (PDA), a digital camera, a portable camcorder, a viewfinder, a navigator, a vehicle, a large-area wall, a household appliance, an information inquiry device (e.g., a business inquiry device of departments such as e-government affairs, banks, hospitals and electric power), etc.

Figure 2:
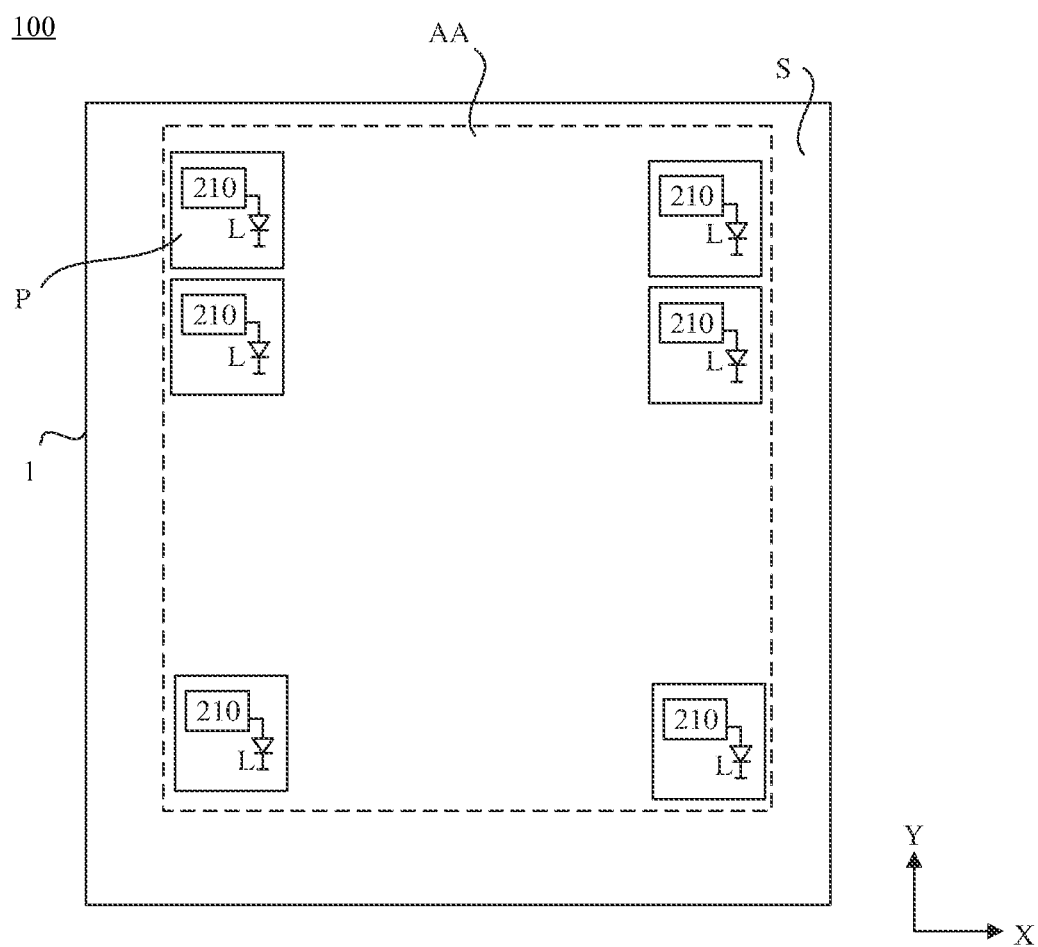
FIG. 2 is a diagram showing a structure of a display panel, in accordance with some embodiments of the present disclosure.

In some embodiments of the present disclosure, referring to FIG. 2, the display apparatus includes a display panel 100. The display panel 100 has a display area AA (also referred to as an active area) and a peripheral area S. The peripheral area S is located on at least one side of the display area. For example, the peripheral area S may be disposed around the display area.

For example, the display panel may be an organic light-emitting diode (OLED) panel, a quantum dot light-emitting diode (QLED) panel, a liquid crystal display (LCD) panel, a mini-light-emitting diode (mini-LED) panel or a micro-light-emitting diode (micro-LED) panel, etc.

For example, the display panel 100 may include a plurality of sub-pixels P that are located in the display area AA. For example, the plurality of sub-pixels P may be arranged in an array. For example, sub-pixels P arranged in a line in an X direction are referred to as sub-pixels in a same row, and sub-pixels P arranged in a line in a Y direction are referred to as sub-pixels in a same column.

For example, the plurality of sub-pixels P include first color sub-pixels P, second color sub-pixels P and third color sub-pixels P. For example, the first color, the second color and the third color are three primary colors, e.g., the first color, the second color and the third color are red, green and blue, respectively. That is, the plurality of sub-pixels P include red sub-pixels P, green sub-pixels P and blue sub-pixels P.

For example, the display apparatus may further include a driver chip. For example, the driver chip is a driver IC. For example, the driver IC includes a source driver. For example, the driver chip is configured to supply a driving signal to each sub-pixel P in the display panel; for example, the driving signal includes a data signal.

For example, the display apparatus may further include a touch board (also referred to as a touch screen, a touch structure or a touch layer). The touch board is used to sense a touch position, and the display panel is controlled to display an image according to the touch position sensed by the touch board, thereby realizing human-machine interaction.

In some embodiments of the present disclosure, referring to FIG. 2, the display panel 100 includes a driving backplane 1 and elements to be driven (e.g., light-emitting devices L). The elements to be driven are disposed on the driving backplane 1, and are driven by the driving backplane 1 to operate.

For example, the elements to be driven are the light-emitting devices L, the driving backplane 1 may be used to drive the light-emitting devices L to emit light. The driving backplane 1 includes a plurality of pixel circuits 210. It will be understood that, as shown in FIG. 2, at least one sub-pixel P (e.g., each sub-pixel P) of the display panel includes a pixel circuit 210 and a light-emitting device L. The pixel circuit 210 is coupled to the light-emitting device L. The pixel circuit 210 is configured to drive the light-emitting device L to emit light. For example, the plurality of pixel circuits are arranged in an array.

A specific structure of the pixel circuit is not limited in embodiments of the present disclosure, and may be designed according to actual conditions. For example, the pixel circuit is composed of electronic devices such as thin film transistor(s) (TFTs) and capacitors (Cs). For example, the pixel circuit may include two thin film transistors (one switching transistor and one driving transistor) and one capacitor to form a 2T1C structure. Of course, the pixel circuit may also include more than two thin film transistors (a plurality of switching transistors and one driving transistor) and at least one capacitor. For example, referring to FIG. 3, the pixel circuit 210 may include a storage capacitor Cst and seven transistors (six switching transistors M1, M2, M3, M4, M5 and M6 and one driving transistor MD) to form a 7T1C structure.

Figure 3:
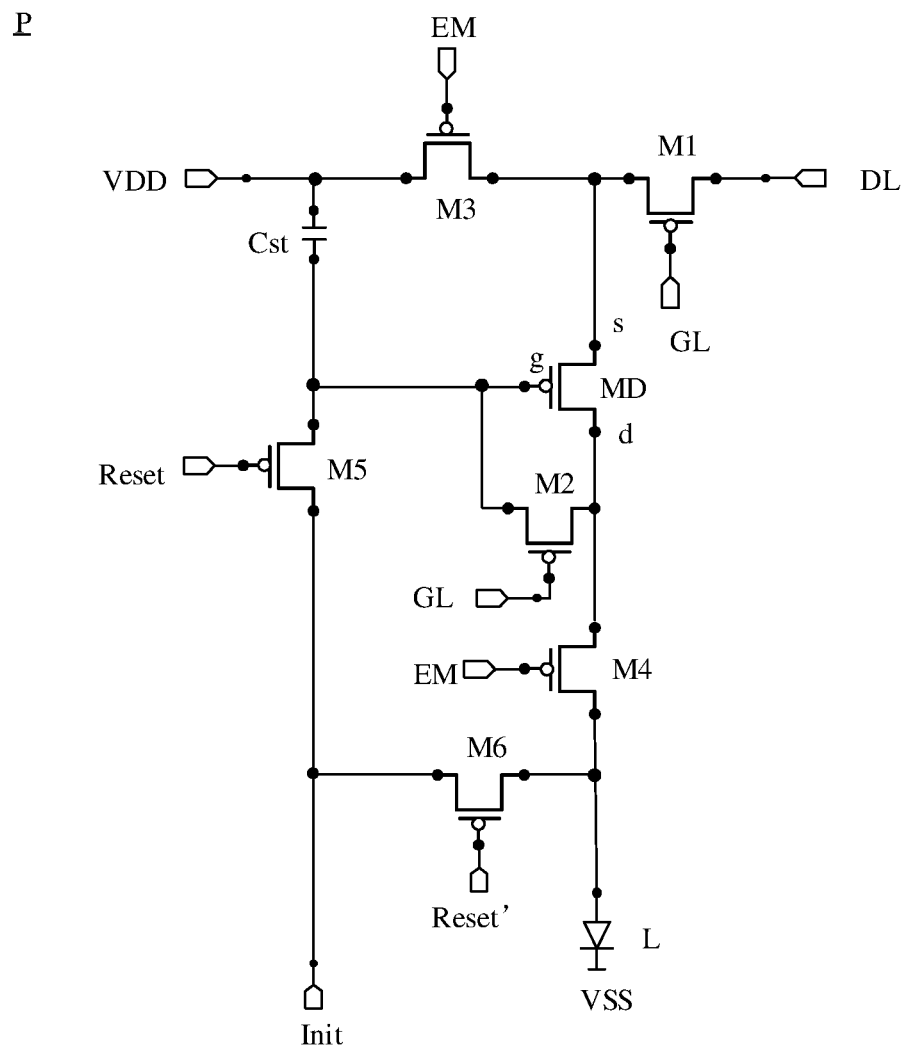
FIG. 3 is a diagram showing a structure of a sub-pixel including a 7T1C pixel circuit, in accordance with some embodiments of the present disclosure.

For example, as shown in FIG. 3, the pixel circuit 210 is of a 7T1C structure. In addition to the pixel circuit, the driving backplane 1 further includes a plurality of signal lines, such as gate lines (GL), data lines (DL), light-emitting control signal lines EM, initialization signal lines Init, and reset signal lines Reset and Reset'. A gate line GL may be used to transmit a gate driving signal. A data line DL is configured to provide a data signal (a data current or a data voltage) for the element to be driven, so as to drive the element to be driven to operate. A light-emitting control signal line EM may be used to transmit a light-emitting control signal. An initialization signal line Init may be used to transmit an initialization signal. A reset signal line may be used to transmit a reset signal.

For example, pixel circuits in the same row may be coupled to a gate line GL, a reset signal line Reset, a reset signal line Reset' and a light-emitting control signal line EM. The reset signal line Reset and the reset signal line Reset' coupled to the pixel circuits in the same row may be two signal lines, which transmit different reset signals. Alternatively, the reset signal line Reset and the reset signal line Reset' may also be the same signal line. For example, pixel circuits in the same column may be coupled to a same data line DL.

For example, in the pixel circuit, control electrodes (gates) of a part of switching transistors (e.g., M5 and M6) each are used to receive a reset signal, control electrodes of another part of switching transistors (e.g., M1 and M2) each are used to receive a gate driving signal, and control electrodes of yet another part of switching transistors (e.g., M3 and M4) each are used to receive a light-emitting control signal. For example, the transistor M5 and the transistor M6 are turned on in response to the reset signal(s), and the initialization signal is transmitted to a control electrode of the driving transistor MD and an anode of the light-emitting device L through the transistor M5 and the transistor M6, so as to reset the control electrode of the driving transistor MD and the anode of the light-emitting device L. The transistor M1 and the transistor M2 are turned on in response to the gate driving signal, so that the control electrode (g) of the driving transistor MD is coupled to a drain (d) of the driving transistor MD, and the driving transistor MD is in a diode-on state. In this case, the data signal is written to a source (s) of the driving transistor MD through the transistor M1, and a compensation signal obtained according to the data signal and a threshold voltage of the driving transistor MD is applied to the control electrode (g) of the driving transistor MD. The transistor M3 and the transistor M4 are turned on in response to the light-emitting control signal, and a current path between a first power supply voltage terminal (coupled to a power supply voltage line VDD and a second power supply voltage terminal VSS is conducted. A driving current generated based on a difference between a voltage of the control electrode (g) of the driving transistor MD and a voltage of a power supply voltage signal (a signal provided by the power supply voltage line VDD) is transmitted to the light-emitting device L through the current path, so as to drive the light-emitting device L to emit light. For example, one electrode (e.g., the anode) of the light-emitting device L is coupled to the pixel circuit, and the other electrode (e.g., a cathode) of the light-emitting device L is coupled to the second power supply voltage terminal VSS. For example, the second power supply voltage terminal VSS is configured to transmit a direct current voltage, such as a direct current low voltage.

For example, the light-emitting device L may be one of light-emitting devices including a light-emitting diode (LED), an organic light-emitting diode (OLED) or a quantum dot light-emitting diode (QLED). The light-emitting device L includes the cathode, the anode, and a light-emitting functional layer located between the cathode and the anode. The light-emitting functional layer may include, for example, a light-emitting layer, a hole transporting layer (HTL) located between the light-emitting layer and the anode, and an electron transporting layer (ETL) located between the light-emitting layer and the cathode. Of course, according to needs, in some embodiments, a hole injection layer (HIL) may further be provided between the HTL and the anode, and an electron injection layer (EIL) may be provided between the ETL and the cathode.

For example, the anode may be made of a transparent conductive material with a high work function, and an electrode material thereof may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), and a carbon nanotube. For example, the cathode may be made of a material with a high conductivity and a low work function, and an electrode material thereof may include alloys such as a magnesium aluminum (MgAl) alloy and a lithium aluminum (LiAl) alloy, or metal elements such as magnesium, aluminum (Al), lithium (Li) and silver (Ag). A material of the light-emitting layer may be selected according to a color of emitted light. For example, the material of the light-emitting layer includes a fluorescent light-emitting material or a phosphorescent light-emitting material. For example, in at least one embodiment of the present disclosure, the light-emitting layer may employ a doping system. That is, a dopant material is mixed into a host light-emitting material to obtain a usable light-emitting material. For example, the host light-emitting material may employ a metal compound material, an anthracene derivative, an aromatic diamine compound, a triphenylamine compound, an aromatic triamine compound, a biphenyldiamine derivative, or a triarylamine polymer.

Figure 4:
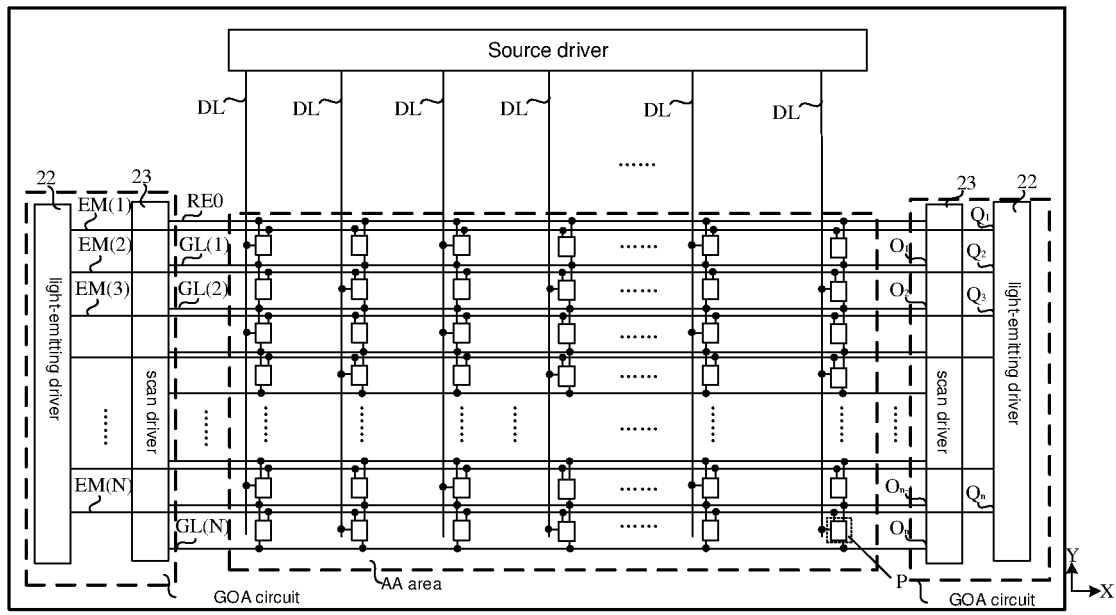
FIG. 4 is a diagram showing a structure of a display panel including a GOA circuit, in accordance with some embodiments of the present disclosure.

For example, referring to FIG. 4, the driving backplane 1 may further include: gate driver on array (GOA) circuits connected to the gate lines GL and/or light-emitting control signal lines EM, and used for supplying gate driving signals to the gate lines GL and/or for supplying light-emitting control signals to the light-emitting control signal lines EM. For example, a GOA circuit may include at least one of a light-emitting driver 22 and a scan driver 23. In a case where the display panel has N rows of sub-pixels, the scan driver 23 has (N+1) signal output terminals (i.e., signal sources for providing gate driving signals and a reset signal). The gate lines GL (i.e., N gate lines GL) coupled to the pixel circuits 210 of a first row of sub-pixels to an Nth row of sub-pixels are GL(1), GL(2), ..., GL(N), and the N gate lines GL are coupled to N first signal output terminals ($O_1, O_2, \ldots, O_N$) of the scan driver 23 in one-to-one correspondence. The pixel circuits of the first row of sub-pixels are also electrically connected to a reset signal line RE0, and the reset signal line RE0 is electrically connected to a remaining signal output terminal of the scan driver 23. The pixel circuits of the first row of sub-pixels are reset under control of a reset signal provided by the reset signal line RE0. Reset signals for a second row of sub-pixels to the Nth row of sub-pixels are transmitted by a respective gate line GL coupled to the previous row of sub-pixels. That is, the gate line GL coupled to the previous row of sub-pixels is also used as a reset signal line corresponding to a current row of sub-pixels, or the gate line GL coupled to the previous row of sub-pixels is coupled to the reset signal line corresponding to the current row of sub-pixels. Similarly, the light-emitting driver 22 has N second signal output terminals (i.e., signal sources for providing light-emitting control signals), which are $Q_1, Q_2, \ldots, Q_N$. The light-emitting control signal lines EM (i.e., N light-emitting control signal lines EM) electrically connected to the pixel circuits 210 of the first row of sub-pixels to the Nth row of sub-pixels are EM(1), EM(2), ..., EM(N), and the N light-emitting control signal lines EM are coupled to the N second signal output terminals of the light-emitting driver 22. A setting of the GOA circuit can not only reduce a degree of the voltage attenuation on the signal lines, but also reduce a bonding process of an external integrated circuit (IC), which has an opportunity to increase a production capacity and reduce a product cost, and may make a frame of the display apparatus narrow and achieve a good display effect.

For example, the driving backplane 1 may adopt a bilateral driving manner. That is, the driving backplane 1 includes two GOA circuits arranged opposite to each other in a row direction. For example, a GOA circuit is provided on each of left and right sides outside the display area in FIG. 4. The scan driver 23 on the left side and the scan driver 23 on the right side include the same number of first signal output terminals. The first signal output terminals with the same sequence on the left and right sides output the same signal and are coupled to the same gate line. For example, a fifth first signal output terminal on the left side and a fifth first signal output terminal on the right side output the same signal, and are both coupled to a gate line GL (5). Similarly, the light-emitting driver 22 on the left side and the light-emitting driver 22 on the right side include the same number of second signal output terminals. The second signal output terminals with the same sequence on the left and right sides output the same signal and are coupled to the same light-emitting control signal line. In this way, the two scan drivers 23 may synchronously scan a plurality of gate lines and a plurality of reset signal lines Reset row by row, and the two light-emitting drivers 22 may synchronously scan a plurality of light-emitting control signal lines row by row. Since a signal on each signal line (the gate line or the light-emitting control signal line) is input from both ends of the signal line, signal attenuation on the signal line may be reduced to a certain extent. For the medium- and large-sized display apparatuses, an effect of reducing the signal attenuation is prominent.

For example, the driving backplane 1 may also adopt a unilateral driving manner. That is, only the GOA circuit is provided on one side of the driving backplane 1. The GOA circuit scans at least one of the plurality of gate lines, the plurality of reset signal lines and the plurality of light-emitting control signal lines row by row.

Hereinafter, a structure of the driving backplane 1 will be described in detail by taking an example in which the driving backplane 1 includes the pixel circuits 210.

In some embodiments of the present disclosure, referring to FIGS. 7 to 12, the driving backplane 1 includes a base 11, a first conductive layer 13 disposed on the base 11, a first insulating layer 12 disposed on a side of the first conductive layer 13 away from the base 11, and a second conductive layer 14 disposed on a side of the first insulating layer 12 away from the first conductive layer 13.

Figure 5:
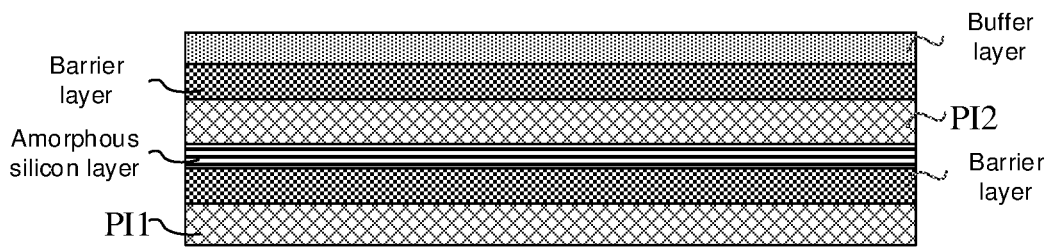
FIG. 5 is a diagram showing a structure of a base, in accordance with some embodiments of the present disclosure.

The base 11 is configured to carry a plurality of film layers of the driving backplane 1. The base 11 may be a blank base substrate. For example, the base substrate may be a rigid base substrate, and the rigid base substrate may be a glass base substrate or a polymethyl methacrylate (PMMA) base substrate. For another example, the base substrate may be a flexible base substrate, and the flexible base substrate may be a polyethylene terephthalate (PET) base substrate, a polyethylene naphthalate two formic acid glycol ester (PEN) base substrate or a polyimide (PI) base substrate. Referring to FIG. 5, the base 11 may include base substrate(s) and at least one film layer, e.g., a barrier layer, a buffer layer, etc., formed on a base substrate. For example, the base 11 may include a plurality of (e.g., two) base units that are stacked, and an amorphous silicon layer may be provided between two adjacent base units to increase adhesion between the two adjacent base units. Each base unit may include a base substrate and a barrier layer disposed on the base substrate.

The first conductive layer 13, the second conductive layer 14, etc. are all pattern layers. A pattern layer refers to a film layer formed through a patterning process. The patterning process refers to a process in which at least one pattern with a certain shape can be formed. For example, a thin film is formed on the base 11 through any of a variety of film forming processes such as deposition, coating, sputtering, and then the thin film is patterned to form a film layer containing at least one pattern, which is referred to as a pattern layer. Steps of patterning include coating photoresist, exposing, developing, etching and stripping the photoresist. In this embodiment, a positional relationship of a plurality of patterns belonging to the same pattern layer is referred to as the same layer arrangement.

Figure 6:
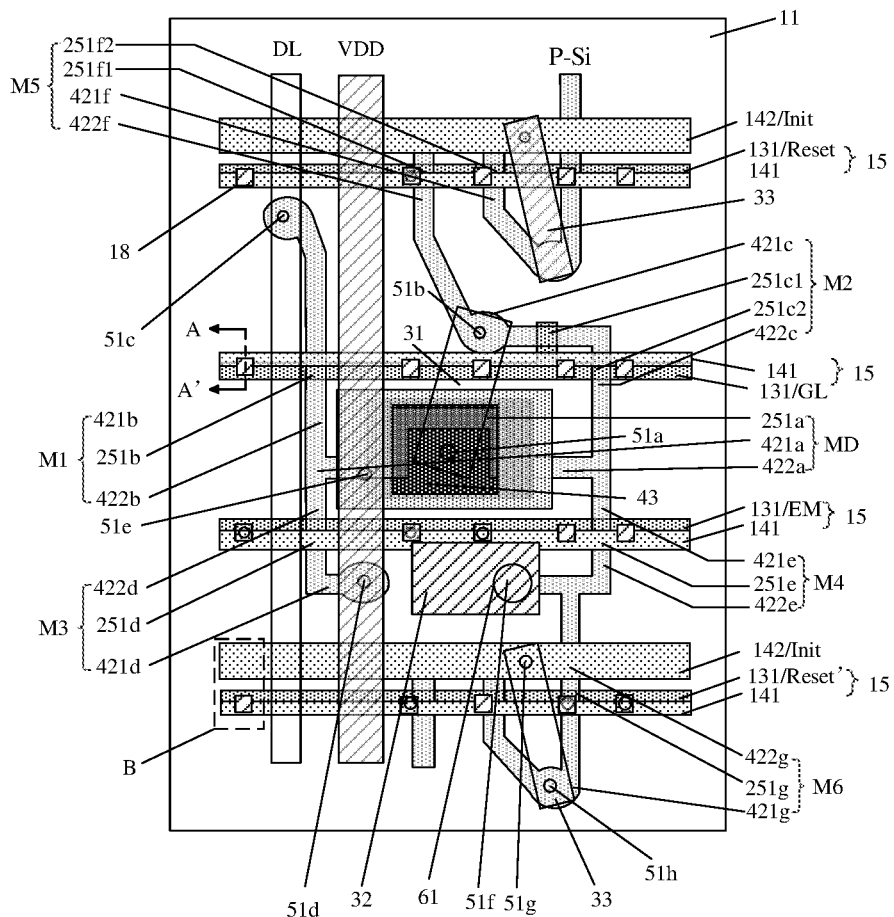
FIG. 6 is a diagram showing a structure of a driving backplane, in accordance with some embodiments of the present disclosure.
Figure 10:
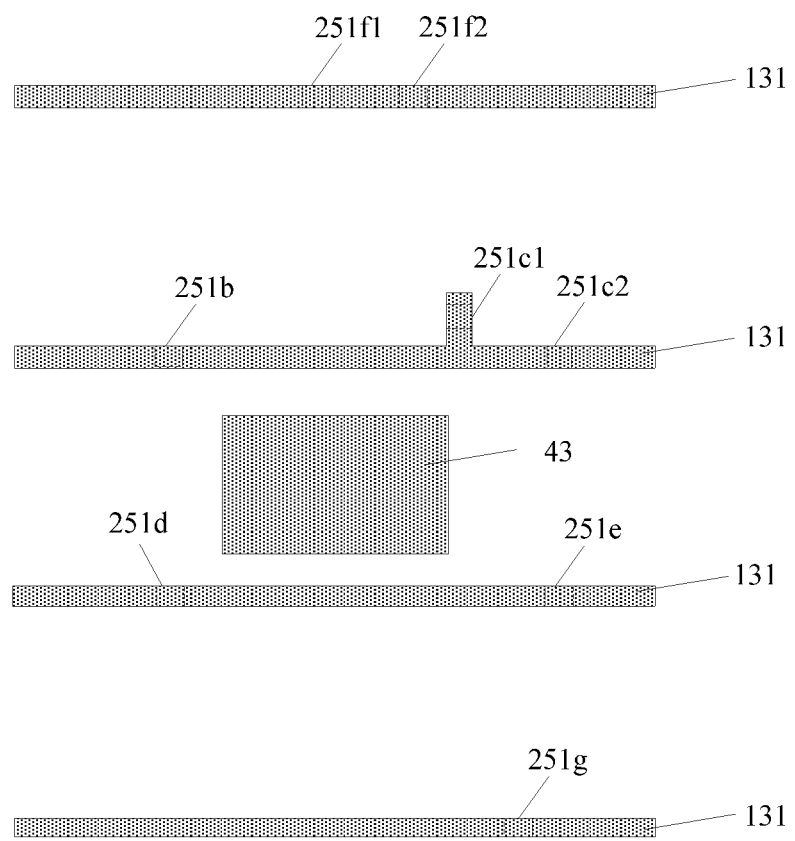
FIG. 10 is a diagram showing a structure of a first conductive layer, in accordance with some embodiments of the present disclosure.

Referring to FIGS. 6 and 10, the first conductive layer 13 includes at least one first signal line 131. For example, the first conductive layer 13 includes a plurality of first signal lines 131 extending in the same direction, and there is a gap between two adjacent first signal lines 131. Each first signal line 131 may be used to transmit a signal, for example, the gate driving signal, the light-emitting control signal, the reset signal, or the like. A material of the first conductive layer 13 is not limited, and may be selected from at least one of metal, alloy, metal oxide conductive material, organic conductive material, carbon nanotube and graphene. For example, the material of the first conductive layer 13 may be molybdenum (Mo).

For example, referring to FIGS. 6 and 10, the first conductive layer 13 may include at least two first signal lines 131, and the at least two first signal lines 131 include at least one of the gate line GL, the light-emitting control signal line EM and the reset signal lines (Reset and Reset'). For example, the first conductive layer 13 includes three types of first signal lines, i.e., the plurality of gate lines GL, the plurality of light-emitting control signal lines EM and the plurality of reset signal lines (Reset and Reset'). In addition, all or part of the first signal lines 131 are located in the display area. Referring to FIG. 4, in some implementations, both ends of the first signal line 131 may extend beyond two opposite edges of the display area AA in an extending direction (the X direction) of the first signal line 131. In some other implementations, in the extending direction (the X direction) of the first signal line 131, one end of the first signal line 131 extends beyond an edge of the display area AA, and the other end of the first signal line 131 is flush with the edge of the display area AA or within the display area AA. In yet some other implementations, in the extending direction (the X direction) of the first signal line 131, both ends of the first signal line 131 are flush with the two opposite edges of the display area AA.

Figure 11:
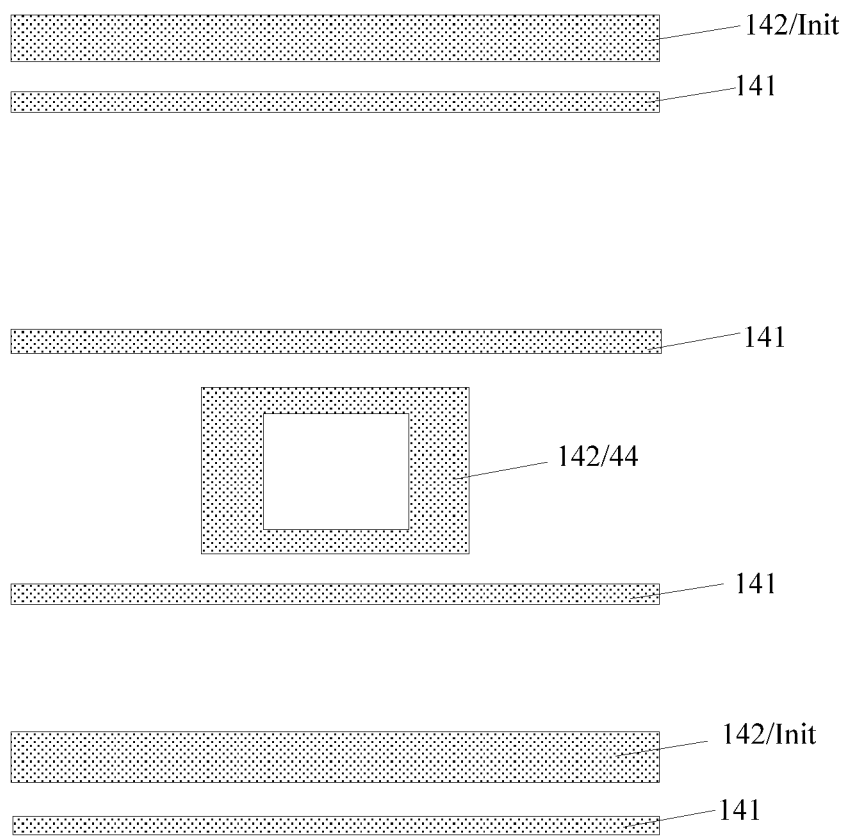
FIG. 11 is a diagram showing a structure of a second conductive layer, in accordance with some embodiments of the present disclosure.

Referring to FIGS. 6 and 11, the second conductive layer 14 includes at least one second signal line 141. For example, the second conductive layer 14 includes a plurality of second signal lines 141, an extending direction of which is parallel to the extending direction of the first signal lines 131, and there is a gap between two adjacent second signal lines 141. For example, the second signal lines 141 and the first signal lines 131 all extend parallel to the X direction. For a material of the second conductive layer 14, reference may be made to the above description of the first conductive layer 13, which will not be repeated herein. It will be understood that materials of the first conductive layer 13 and the second conductive layer 14 may be the same or different.

Figure 7:
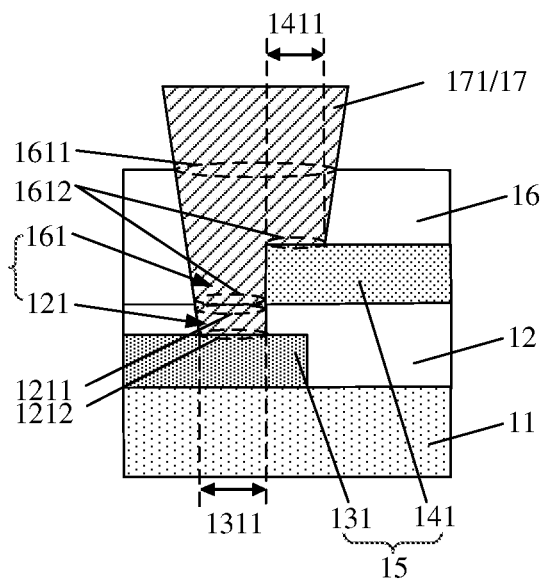
FIG. 7 is a sectional view of the driving backplane in FIG. 6 taken along the A-A' direction.
Figure 8:
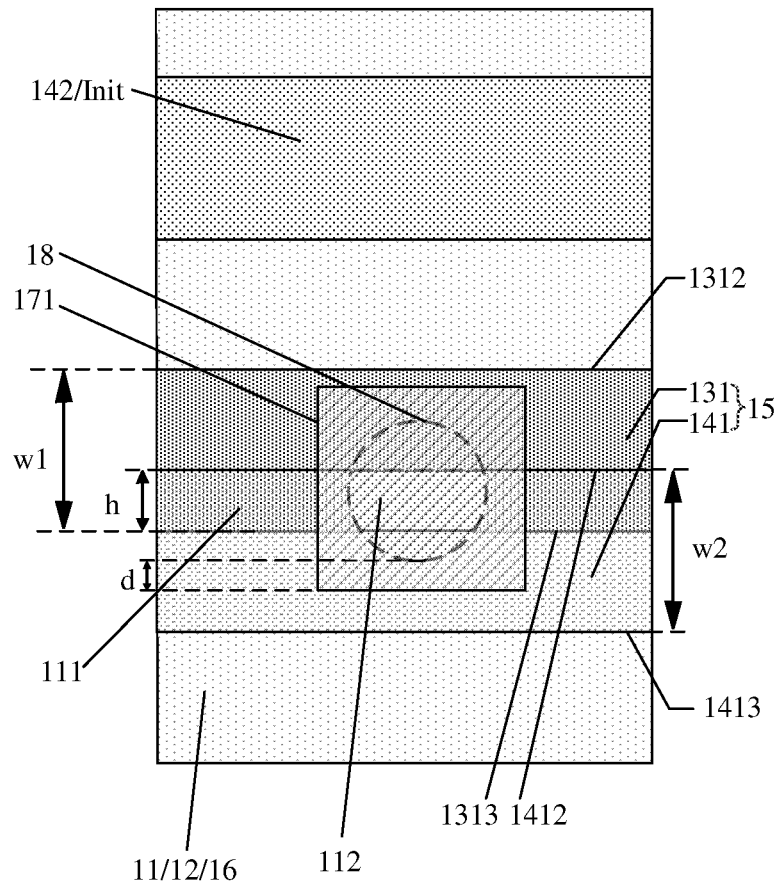
FIG. 8 is an enlarged diagram showing a structure of the B region of the driving backplane in FIG. 6.

For example, referring to FIGS. 6, 7 and 8, each first signal line 131 and a respective second signal line 141 constitute a signal line pair 15. In the signal line pair 15, extending directions of the first signal line 131 and the second signal line 141 are parallel to each other. All or part of the second signal line(s) 141 are located in the display area. In some implementations, in the signal line pair 15, both ends of the second signal line 141 may be flush with the both ends of the first signal line 131 in the extending direction (the X direction) of the second signal line 141. In this case, the second signal line 141 and the first signal line 131 have the same length. In some other implementations, in the signal line pair 15, at least one of the both ends of the second signal line 141 is located on a side of a corresponding end of the first signal line 131 proximate to the opposite end thereof in the extending direction (the X direction) of the second signal line 141. For example, a left end of the second signal line 141 is on a right side of a left end of the first signal line 131, and a right end of the second signal line 141 is on a left side of a right end of the first signal line 131. In this way, a length of the second signal line 141 is less than a length of the first signal line 131. In yet some other implementations, the second signal line 141 may include a plurality of signal sub-lines arranged spaced apart in the extending direction of the second signal line 141.

Referring to FIGS. 6 to 8, in the signal line pair 15, an orthogonal projection of the first signal line 131 on the base 11 and an orthogonal projection of the second signal line 141 on the base 11 have a first overlapping region 111. The orthogonal projection of the second signal line 141 on the base 11 may be completely covered by the orthogonal projection of the first signal line 131 on the base 11, or may be partly within the orthogonal projection of the first signal line 131 on the base 11. For example, referring to FIG. 8, in the display area, in a width direction of the second signal line 141 (i.e., the Y direction), in two opposite edges of the orthogonal projection of the second signal line 141, all or part of one edge is located between two opposite edges of the orthogonal projection of the first signal line 131 on the base 11, and the other edge is located outside the two opposite edges of the orthogonal projection of the first signal line 131 on the base 11 or flush with one of the two opposite edges of the orthogonal projection of the first signal line 131 on the base 11. For another example, in the display area, in the width direction of the second signal line 141 (i.e., the Y direction), the two opposite edges of the orthogonal projection of the second signal line 141 on the base 11 is flushed with the two opposite edges of the orthogonal projection of the first signal line 131 on the base 11. It will be understood that the orthogonal projection of the first signal line 131 on the base 11 is a projection of the first signal line 131 on the base 11 in a direction vertical to the base 11.

In addition, in the signal line pair 15, the first signal line 131 is coupled to the second signal line 141. A coupling of the first signal line 131 and the second signal line 141 may be a direct connection. For example, the second signal line 141 extends through the first insulating layer 12 to be coupled to the first signal line 131. Alternatively, A coupling of the first signal line 131 and the second signal line 141 may also be that the second signal line 141 is indirectly connected to the first signal line 131 through other conductive structure(s).

Figure 9:
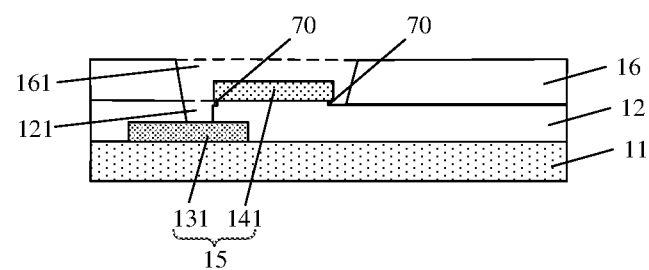
FIG. 9 is a diagram showing a structure of a via hole pair, in accordance with some embodiments of the present disclosure.

Referring to FIGS. 8 and 9, the first insulating layer 12 is located between the first conductive layer 13 and the second conductive layer 14. A material of the first insulating layer 12 may be silicon nitride, silicon oxide or the like.

In the embodiments of the present disclosure, in the signal line pair, coupling the first signal line 131 and the second signal line 141 is equivalent to connecting the first signal line 131 and the second signal line 141 in parallel. It will be understood that a surface resistance of the signal line pair is reduced compared to a surface resistance of the first signal line 131. When the signal line pair is used to transmit the signal, a load caused by a resistance-capacitance (RC) circuit formed by the signal line pair may be reduced due to the fact that the surface resistance of the signal line pair is reduced. In a case where a transmission distance is fixed, the degree of the voltage attenuation caused by the surface resistance may be reduced, and a probability of color abnormality of sub-pixels in an extending direction of the signal line pair may be reduced, so that a good display effect may be achieved. In addition, in the same signal line pair 15, the orthogonal projection of the first signal line 131 on the base 11 and the orthogonal projection of the second signal line 141 on the base 11 have the first overlapping region 111, so that a space occupied by wiring is small, which may effectively avoid space wiring limitation.

In some embodiments of the present disclosure, as shown in FIGS. 7 and 8, the driving backplate 1 may further include a second insulating layer 16 disposed on a side of the second conductive layer 14 away from the base 11, and a third conductive layer 17 disposed on a side of the second insulating layer 16 away from the base 11. The third conductive layer 17 includes at least one first conductive pattern 171 (e.g., a plurality of first conductive patterns 171). Each first conductive pattern 171 extends through the second insulating layer 16 to be coupled to a second signal line 141, and each first conductive pattern 171 extends through the second insulating layer 16 and the first insulating layer 12 to be coupled to a first signal line 131. The first signal line 131 and the second signal line 141 that are in the same signal line pair are coupled through the first conductive pattern 171, so as to achieve the purpose of reducing the resistance and improving the display effect. It will be understood that, a position where the first conductive pattern 171 extends through the second insulating layer 16 and the first insulating layer 12 to be coupled to the first signal line 131 may be the same as or different from a position where the first conductive pattern 171 extends through the second insulating layer 16 to be coupled to the second signal line 141. Regardless of whether the positions are the same or not, when the driving backplane is manufactured, the first conductive layer 13, a first insulating film (a whole layer of insulating material), the second conductive layer 14, and a second insulating film (a whole layer of insulating material) may be sequentially formed on the base, and then via holes are formed at the above positions through a patterning process, so that a corresponding electrical connection may be achieved upon the third conductive layer 17 is formed.

Since via holes of the two insulating layers may be formed by a single patterning process, a process is simple while the resistance is reduced, and accordingly, a production cost will be saved.

In some embodiments of the present disclosure, referring to FIGS. 6 to 8, the first insulating layer 12 has at least one first via hole 121, and the second insulating layer 16 has at least one second via hole 161. Each first via hole and a respective second via hole 161 constitute a via hole pair 18. In the via hole pair 18, the first via hole 121 is communicated with the second via hole 161. A portion of the first signal line 161 exposed by the via hole pair 18 is a first connection portion 1311, and a portion of the second signal line 141 exposed by the second via hole 161 in the via hole pair 18 is a second connection portion 1411. Since the via hole pair 18 exposes both the first connection portion 1311 and the second connection portion 1411, a position of the via hole pair 18 at least corresponds to a position where the first signal line 161 and the second signal line 141 overlap, and further corresponds to a position, next to the overlapping position, where the first signal line 161 is not shielded by the second signal line 141. That is, an orthogonal projection of the via hole pair 18 on the base 11 and the first overlapping region 111 have a second overlapping region 112. The first conductive pattern 171 is contact with the second connection portion 1411 through the second via hole 161 in the corresponding via hole pair 18, and is contact with the first connection portion 1311 through the corresponding via hole pair 18. Thus, the first conductive pattern 171 can be connected to both the first signal line 161 and the second signal line 141 through a same via hole pair 18, the number of via holes may be reduced, and sizes of the first signal line 161 and the second signal line 141 connected to each other through a via hole pair may be reduced. In this way, although the first conductive pattern 171 is added in this embodiment, it is not necessary to increase a size of a sub-pixel. It will be understood that shapes of the first via hole 121 and the second via hole 161 may be a circle, a triangle, a square, etc. The shapes of the first via hole 121 and the second via hole 161 may be the same or different. The first via hole 121 and the second via hole 161 may be formed in the same patterning process, or may be formed in two patterning processes.

In some embodiments of the present disclosure, referring to FIG. 7, the first via hole 121 has a first opening 1211 and a second opening 1212 opposite to each other, and the first opening 1211 is far away from the base 11 compared to the second opening 1212. The second via hole 161 has a third opening 1611 and a fourth opening 1612 opposite to each other, and the third opening 1611 is far away from the base 11 compared to the fourth opening 1612. A portion of the second insulating layer 16 is in contact with the second signal line 141 and the other portion thereof is in contact with the first insulating layer 12, so that a portion of the fourth opening 1612 of the second via 161 in the second insulating layer 16 corresponds to the second signal line 141 and the remaining portion thereof corresponds to the second insulating layer 16. In the same via hole pair 18, a combination of an orthogonal projection of the first opening 1211 on the base 11 and an orthogonal projection of the second connection portion 1411 on the base 11 substantially coincides with an orthogonal projection of the fourth opening 1612 on the base 11. It will be understood that, in order to realize the above design of the via hole pair 18, when the driving backplane is manufactured, the first conductive layer 13, the first insulating film, the second conductive layer 14 and the second insulating film may be sequentially formed on the base, and then the via hole pair 18 is formed in the first insulating film and the second insulating film through a single patterning process. Since only one mask is needed for the single patterning process, an effect of reducing production costs may be achieved. In the via hole pair 18, referring to FIGS. 7 and 8, the combination of the orthogonal projection of the first opening 1211 on the base 11 and the orthogonal projection of the second connecting portion 1411 on the base 11 substantially coincides with the orthogonal projection of the fourth opening 1612 on the base 11, which means that the two orthogonal projections may coincide, or may be slightly different due to over-etching in the patterning process. The first conductive pattern 171 is coupled to the first signal line 131 and the second signal line 141 through the via hole pair 18, and the purpose of reducing the resistance and improving the display effect may be achieved.

In some embodiments of the present disclosure, referring to FIG. 8, an orthogonal projection of the via hole pair 18 on the base 11 is contained within a border of an orthogonal projection of the signal line pair 15 on the base 11. That is, the orthogonal projection of the via hole pair 18 on the base 11 is located within the border of the orthogonal projection of the signal line pair 15 on the base 11, or the orthogonal projection of the signal line pair 15 on the base 11 completely covers the orthogonal projection of the via hole pair 18 on the base 11, and there may be a gap between the two orthogonal projections. The orthogonal projection of the via hole pair 18 on the base 11 is an orthogonal projection of the largest opening (e.g., the third opening 1611) of the via hole pair 18 on the base 11. The orthogonal projection of the signal line pair 15 on the base 11 refers to a combination of the orthogonal projections of the first signal line 131 and the second signal line 141 that are in the signal line pair 15 on the base 11.

Figure 13:
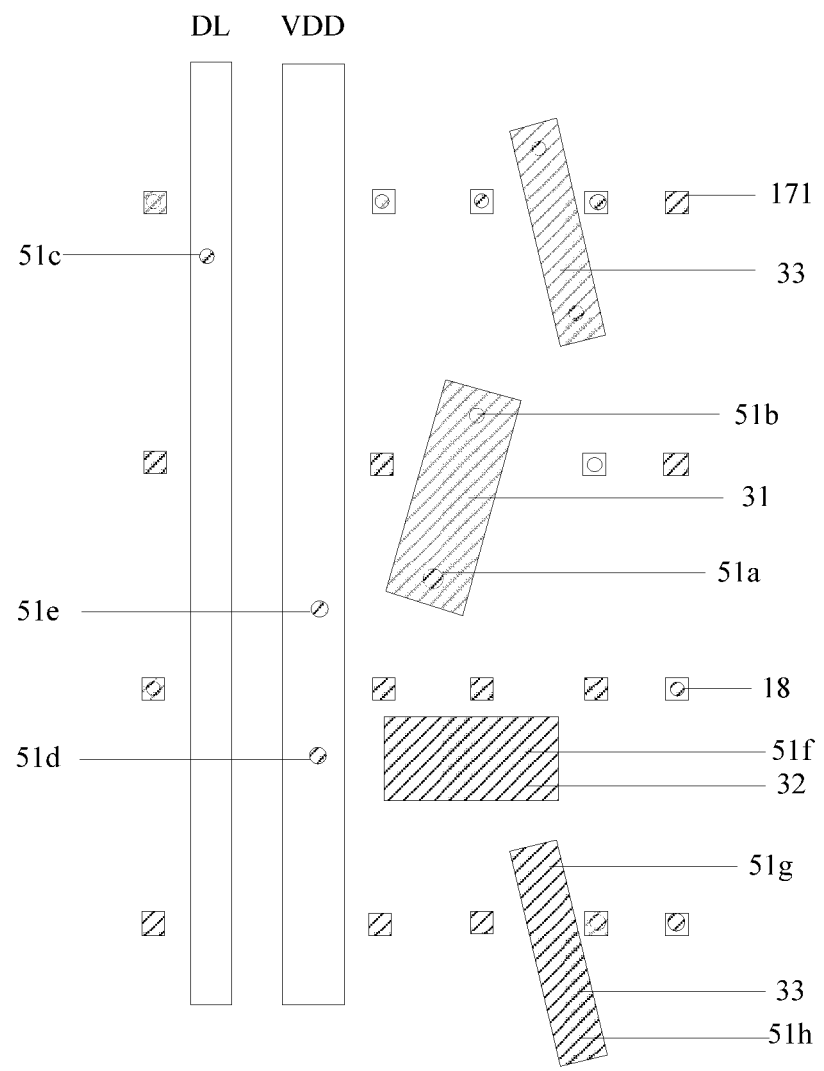
FIG. 13 is a diagram showing structures of a third conductive layer and via holes, in accordance with some embodiments of the present disclosure.

In some embodiments of the present disclosure, referring to FIGS. 6 and 13, in the same signal line pair 15, the first signal line 131 is coupled to the second signal line 141 through a plurality of via hole pairs 18, and the plurality of via hole pairs 18 are arranged in the extending direction of the first signal line 131. It will be understood that, since there are the plurality of via hole pairs 18 for achieving electrical connection of the first signal line 131 and the second signal line 141, even if a poor connection occurs in a certain first conductive pattern 171, other first conductive patterns 171 still implement the coupling of the first signal line 131 and the second signal line 141 through a corresponding via hole pair 18, thereby improving reliability of the display apparatus.

In some embodiments of the present disclosure, referring to FIG. 8, an orthogonal projection of the first conductive pattern 171 on the base 11 completely covers the orthogonal projection of the via hole pair 18 on the base 11. It will be understood that, if the orthogonal projection of the first conductive pattern 171 on the base 11 does not completely cover the orthogonal projection of the via hole pair 18 on the base 11, the first conductive pattern 171 does not fill the via hole pair 18, resulting in an increased probability of the poor connection and reduced connection reliability. Therefore, the solution in this embodiment may avoid the above problem.

In some embodiments of the present disclosure, referring to FIG. 8, each film layer of the driving backplane 1 is formed depending on mechanical equipment(s). Subject to the technical level of the existing process, it is difficult for a mechanical equipment to achieve completely precise alignment, and the alignment accuracy may only be controlled within a preset range. The alignment accuracy is a position alignment error between etched patterns of layers that need to be aligned in the display panel. For example, the orthogonal projections of the first conductive patterns 171, formed by etching, on the base 11 have first geometric centers, and the orthogonal projections of the via hole pairs 18, completely covered by the first conductive patterns 171, on the base 11 have second geometric centers. In an ideal condition, a first geometric center completely coincides with a corresponding second geometric center, and the alignment accuracy is 0 μm. Whereas, in a non-ideal condition, subject to a process level and a process equipment, the first geometric center and the second geometric center may not coincide. In a case where the first geometric center does not coincide with the second geometric center, a maximum value of linear distances between the first geometric centers and the second geometric centers is the alignment accuracy. Due to an influence of the alignment accuracy of the equipment, and considering that the via hole pair 18 needs to be completely covered to avoid a problem of the poor connection caused by incompletely covering the via hole pair 18, a minimum distance d between an edge of the orthogonal projection of the first conductive pattern 171 on the base 11 and an edge of the orthogonal projection of the via hole pair 18 on the base 11 may be greater than or equal to the alignment accuracy of the equipment. For example, in a case where the alignment accuracy of the equipment is 0.5 μm, it is necessary to ensure that the minimum distance d between the edge of the orthogonal projection of the first conductive pattern 171 on the base 11 and the edge of the orthogonal projection of the via hole pair 18 on the base 11 is greater than or equal to 0.5 μm. For example, the minimum distance d between the edge of the orthogonal projection of the first conductive pattern 171 on the base 11 and the edge of the orthogonal projection of the via hole pair 18 on the base 11 is greater than or equal to one sixth of a width of the first signal line 131. It will be understood that, the minimum distance d between the edge of the orthogonal projection of the first conductive pattern 171 on the base 11 and the edge of the orthogonal projection of the via hole pair 18 on the base 11 will change with a change of the alignment accuracy of the equipment, and it is not limited to a particular value as long as the the via hole pair 18 can be completely covered finally. It will be understood that the alignment accuracy is related to the process level and the process equipment. For example, in a case where the process level is improved and a more advanced process equipment is adopted, an alignment of an operating position in the process will be more accurate, and a value of the alignment accuracy will also be smaller.

In some embodiments of the present disclosure, referring to FIG. 8, in order to achieve a reasonable spatial wiring, the orthogonal projection of the first signal line 131 on the base 11 and the orthogonal projection of the second signal line 141 on the base 11 have the first overlapping region 111, and in a width direction of the first signal line, a ratio of a width of the first overlapping region 111 to a width of the first signal line is in a range of one third to one half. For example, in a case where the width of the first signal line 131 is 3 μm, the width of the first overlapping region 111 may be 1 μm.

In order to ensure that the width of the first overlapping region 111 is within a preset range and eliminate the influence of the alignment accuracy of the equipment, the width h of the first overlapping region 111 may be a sum or a difference of one third of the width of the first signal line 131 and the alignment accuracy in a width direction of the first signal line 131. For example, in a case where the width of the first signal line 131 is 3 μm and the alignment accuracy is 0.5 μm, the width of the first overlapping region 111 may be a sum or a difference of 1 μm and 0.5 μm (i.e., (1±0.5) μm). That is, the width h of the first overlapping region 111 is in a range of 0.5 μm to 1.5 μm, and the ratio of the width h of the first overlapping region 111 to the width of the first signal line is in a range of one third to one half. The width of the first signal line 131 herein may be understood as an average width of a portion of the first signal line 131 corresponding to the first overlapping region 111. For another example, without considering the width of the first signal line 131 and the alignment accuracy, the width h of the first overlapping region 111 may still be in a range of 0.5 μm to 1.5 μm.

In some embodiments of the present disclosure, referring to FIG. 8, the width w1 of the first signal line 131 and the width w2 of the second signal line 141 in the same signal line pair 15 are equal, for example, are both 3 μm, and the width of the first overlapping region 111 may be a sum or a difference of 1 μm and 0.5 μm (i.e., (1±0.5) μm). The orthogonal projection of the via hole pair 18 corresponding to the same signal line pair 15 on the base 11 may be in a shape of a circle, and a diameter of the circle may be 2 μm, which ensures that the orthogonal projection of the via hole pair 18 on the base 11 is located within the border of the orthogonal projection of the signal line pair 15 on the base 11. The orthogonal projection of the first conductive pattern 171 on the base 11 may be in a shape of a square, and a side length of the square may be 3 μm, so as to completely cover the via hole pair 18 to ensure a connection effect. It will be understood that the above numerical values may be changed according to process conditions and design requirements, and they are not limited to particular numerical values as long as a corresponding effect may be achieved.

In some embodiments of the present disclosure, referring to FIGS. 6, 10 and 11, the pixel circuit 210 further includes at least one capacitor C (e.g., a storage capacitor C). Each capacitor C includes two electrode plates, i.e., a first electrode plate 43 and a second electrode plate 44. The second electrode plate 44 is located on a side of the first electrode plate 43 away from the base 11. For example, the first electrode plate 43 and the first signal line 131 are disposed in the same layer, and they are included in the first conductive layer 13. The second electrode plate 44 and the second signal line 141 are disposed in the same layer, and they are include in the second conductive layer 14.

In some embodiments of the present disclosure, referring to FIG. 11, in addition to the second signal line 141, the second conductive layer 14 further includes at least one second conductive pattern 142. For example, the second conductive layer 14 further includes at least two second conductive patterns 142, and the at least two second conductive patterns 142 include electrode plates of capacitors C in the pixel circuits 210 and/or initialization signal lines Init. For example, the second conductive layer 14 includes two types of second conductive patterns 142, which are the second electrode plates 44 of the capacitors C in the pixel circuits 210 and the initialization signal lines Init. An extending direction of the initialization signal lines Init may be the same as the extending direction of the gate lines GL.

In some embodiments of the present disclosure, referring to FIGS. 6 and 8, in a signal line pair 15 adjacent to the second conductive pattern 142, the first signal line 131 is closer to the second conductive pattern 142 than the second signal line 141. There is no other second conductive patterns 142 or other signal line pairs 15 between the signal line pair 15 and the second conductive pattern 142 that are adjacent to each other. The first signal line 131 in the signal line pair 15 has a first edge 1312 and a second edge 1313 opposite to each other in the width direction of the first signal line 131. An orthogonal projection of the first edge 1312 on the base 11 is closer to an orthogonal projection of the second conductive pattern 142 on the base 11 than an orthogonal projection of the second edge 1313 on the base 11. The second signal line 141 in the signal line pair 15 has a third edge 1412 and a fourth edge 1413. An orthogonal projection of the third edge 1412 on the base 11 is closer to the orthogonal projection of the second conductive pattern 142 on the base 11 than an orthogonal projection of the fourth edge 1313 on the base 11. The first signal line 131 is closer to the second conductive pattern 142 than the second signal line 141. That is, in the signal line pair 15, the orthogonal projection of the first edge 1312 on the base 11 is closer to the orthogonal projection of the second conductive pattern 142 on the base 11 than the orthogonal projection of the third edge 1412 on the base 11. It will be understood that in a case where the second signal line 141 is farther away from the second conductive pattern 142 than the first signal line 131, there is a gap between the second signal line 141 and the second conductive pattern 142 in the width direction of the second signal line 141. The gap can ensure that the second signal line 141 and the second conductive pattern 142 that are disposed in the same layer are insulated from each other, so as to avoid that the second signal line 141 and the second conductive pattern 142 are connected to each other to generate short circuit due to the alignment accuracy of the equipment. As a result, a relatively low alignment accuracy of the equipment may be required, and it is easy to achieve the insulation between the second signal line 141 and the second conductive pattern 142 disposed on the same layer under the existing process level conditions.

Figure 12:
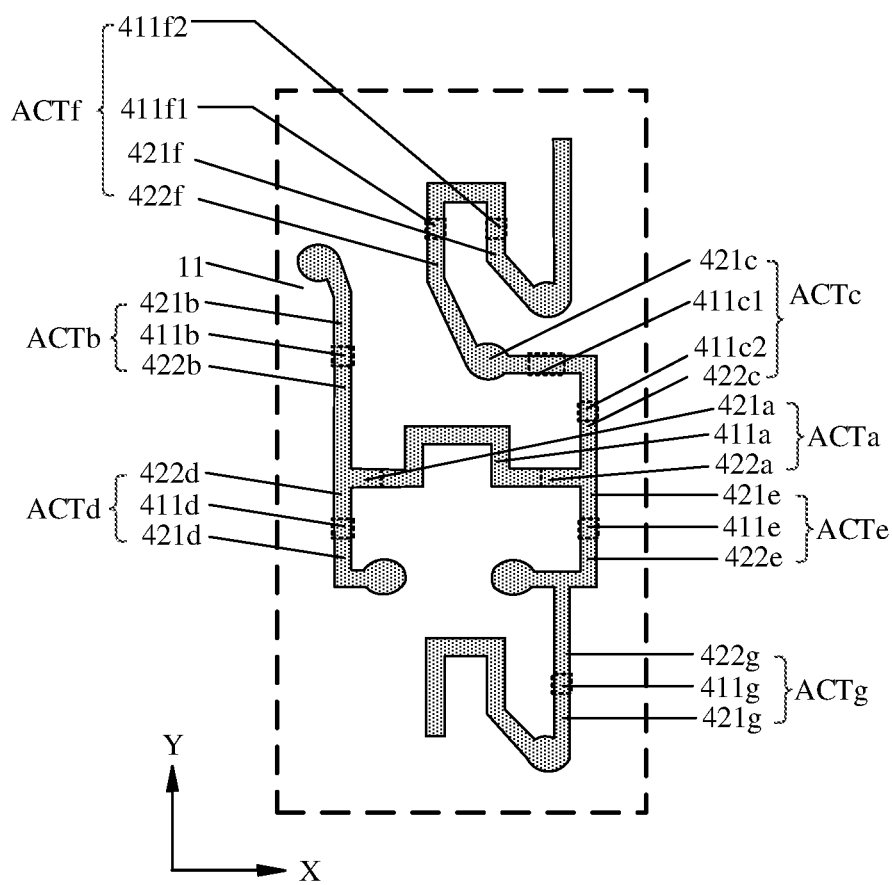
FIG. 12 is a diagram showing a structure of an active layer, in accordance with some embodiments of the present disclosure.

In some embodiments of the present disclosure, referring to FIG. 12, the driving backplane 1 further includes an active pattern layer 40. The active pattern layer 40 is disposed on a side of the first conductive layer 13 proximate to the base 11. For example, the active pattern layer 40 is insulated from the first conductive layer 13. For example, a gate insulating layer is provided between the active pattern layer 40 and the first conductive layer 13. The active pattern layer 40 includes semiconductor pattern(s) 41 and conductorized pattern(s) 42. For example, a semiconductor material film is formed on the base 11, and portions of the semiconductor material film are conductorized. For example, ions are doped into the semiconductor material film to obtain the conductorized patterns 42. Portion(s) of the semiconductor material film that are not conductorized are the semiconductor pattern(s) 41. Each semiconductor pattern 41 separates two conductorized patterns in a plurality of conductorized patterns 42.

For example, the pixel circuit includes a plurality of transistors. Each transistor includes an active layer, the active layer includes a channel portion, a first electrode portion and a second electrode portion, and the first electrode portion and the second electrode portion are located on both sides of the channel portion. For example, one of the first electrode portion and the second electrode portion is a source portion, and the other is a drain portion. It will be understood that the semiconductor pattern(s) include the channel portion in the active layer, and the conductorized patterns include the first electrode portion and the second electrode portion in the active layer. Accordingly, the conductorized patterns are located on both sides of a semiconductor pattern.

In some embodiments of the present disclosure, referring to FIGS. 3, 6 and 12, the plurality of transistors in the pixel circuit include the driving transistor MD. A portion, an orthogonal projection of which overlaps with an orthogonal projection of the first electrode plate 43 on the base 11, of the active pattern layer 40 serves as a channel portion 411a in an active layer ACTa of the driving transistor in the pixel circuit. A portion of the first electrode plate 43 corresponding to the channel portion 411a in the active layer ACTa of the driving transistor serves as a control electrode 251a (i.e., a gate) of the driving transistor.

For example, referring to FIGS. 3, 6 and 12, the plurality of transistors in the pixel circuit 210 include a first transistor M1 and a second transistor M2. Portions, orthogonal projections of which overlap with an orthogonal projection of the gate line GL on the base 11, of the active pattern layer 40 serve as a channel portion 411b in an active layer ACTb of the first transistor and channel portions 411c1 and 411c2 in an active layer ACTc of the second transistor. A second electrode portion 422b in the active layer ACTb of the first transistor is connected to a first electrode portion 421a in the active layer ACTa of the driving transistor, and a second electrode portion 422c in the active layer ACTc of the second transistor is connected to a second electrode portion 422a in the active layer ACTa of the driving transistor. For example, a portion, corresponding to the channel portion 411b in the active layer ACTb of the first transistor, of the gate line GL may serve as a control electrode (i.e., a gate) 251b of the first transistor. For example, channel portions included in the active layer ACTc of the second transistor are 411c1 and 411c2. Portions, corresponding to the channel portions 411c1 and 411c2 in the active layer ACTc of the second transistor, of the gate line GL may serve as control electrodes (i.e., gates) 251c1 and 251c2 of the second transistor. That is, the second transistor has a dual-gate structure, which may avoid generation of leakage current.

The light-emitting control signal line EM and the gate line GL are arranged at intervals, and an extending direction of the light-emitting control signal line EM is parallel to an extending direction of the gate line GL. The plurality of transistors in the pixel circuit further includes a third transistor M3 and a fourth transistor M4. Portions, orthogonal projections of which overlap with an orthogonal projection of the light-emitting control signal line EM on the base 11, of the active pattern layer 40 serve as a channel portion 411d in an active layer ACTd of the third transistor and a channel portion 411e in an active layer ACTe of the fourth transistor. For example, a portion, corresponding to the channel portion 411d in the active layer of the third transistor, of the light-emitting control signal line EM may serve as a control electrode 251d of the third transistor, and a portion, corresponding to the channel portion 411e in the active layer of the fourth transistor, of the light-emitting control signal line EM may serve as a control electrode 251e of the fourth transistor. A second electrode portion 422d in the active layer ACTd of the third transistor is connected to the first electrode portion 421a in the active layer ACTa of the driving transistor and the second electrode portion 422b in the active layer ACTb of the first transistor without gaps. For example, the active layer ACTd of the third transistor, the active layer ACTa of the driving transistor and the active layer ACTb of the first transistor are connected as an integral structure. A first electrode portion 421e in the active layer ACTe of the fourth transistor is connected to the second electrode portion 422a in the active layer ACTa of the driving transistor and the second electrode portion 422c in the active layer ACTc of the second transistor without gaps. For example, the active layer ACTe of the fourth transistor, the active layer ACTa of the driving transistor and the active layer ACTc of the second transistor are connected as an integral structure.

In some embodiments of the present disclosure, referring to FIGS. 6 and 13, the third conductive layer 17 further includes at least one third conductive pattern 31. For example, the third conductive layer 17 may include a plurality of third conductive patterns 31, each pixel circuit includes a third conductive pattern 31. The third conductive pattern 31 may electrically connect the first electrode plate 43 and the first electrode portion 421c in the active layer ACTc of the second transistor. For example, the first electrode portion 421c in the active layer ACTc of the second transistor is coupled to the third conductive pattern 31. For example, the third conductive pattern 31 is in contact with the first electrode portion 421c in the active layer ACTc of the second transistor through a via hole 51b in film layers (e.g., including interlayer dielectric layers and the gate insulating layer) sandwiched therebetween. For example, the first electrode plate 43 is coupled to the third conductive pattern 31. For example, the third conductive pattern 31 is in contact with the first electrode plate 43 through a via hole 51a in film layers (e.g., including an interlayer dielectric layer and the gate insulating layer) sandwiched therebetween.

In some embodiments of the present disclosure, referring to FIGS. 6 and 13, the third conductive layer 17 further includes at least one data line DL (e.g., a plurality of data lines DL). The first electrode portion in the active layer of the first transistor is coupled to a data line DL. For example, the data line DL is in contact with the first electrode portion 421b in the active layer ACTb of the first transistor through a via hole 51c in the film layers (e.g., including the interlayer dielectric layers and the gate insulating layer) sandwiched therebetween.

In some embodiments of the present disclosure, referring to FIGS. 6 and 13, the third conductive layer 17 further includes at least one power supply voltage line VDD (e.g., a plurality of power supply voltage lines VDD). An extending direction of the power supply voltage line VDD is the same as an extending direction of the data line DL, and an orthogonal projection of each power supply voltage line VDD on the base 11 and an orthogonal projection of each data line DL on the base 11 have no overlapping region. That is, there is a gap between each power supply voltage line VDD and each data line DL in a width direction thereof. The first electrode portion in the active layer of the third transistor is coupled to the power supply voltage line. For example, the power supply voltage line VDD is in contact with the first electrode portion 421d in the active layer of the third transistor through a via hole 51d in the film layers (e.g., including the interlayer dielectric layers and the gate insulating layer) sandwiched therebetween. In addition, the second electrode plate 44 in the capacitor C is coupled to the power supply voltage line VDD. For example, the power supply voltage line VDD is in contact with the second electrode plate 44 in the capacitor C through a via hole 51e in film layers (e.g., including an interlayer dielectric layer) sandwiched therebetween. It will be understood that the data line DL and the power supply voltage line VDD may belong to the same pattern layer, e.g., the third conductive layer 17. That is, the data line DL and the power supply voltage line VDD are disposed in the same layer. In a case where the data line DL and the power supply voltage line VDD are disposed in the same layer, the data line DL and the power supply voltage line VDD may be formed by only using one mask through a single patterning process, which may simplify a manufacturing process and save manufacturing costs. In addition, the data line DL and the power supply voltage line VDD may also be disposed in different layers. For example, the data line DL belongs to the third conductive layer 17, and the power supply voltage line VDD may belong to a conductive pattern layer on a side of the third conductive layer 17 away from the base 11.

Figure 14:
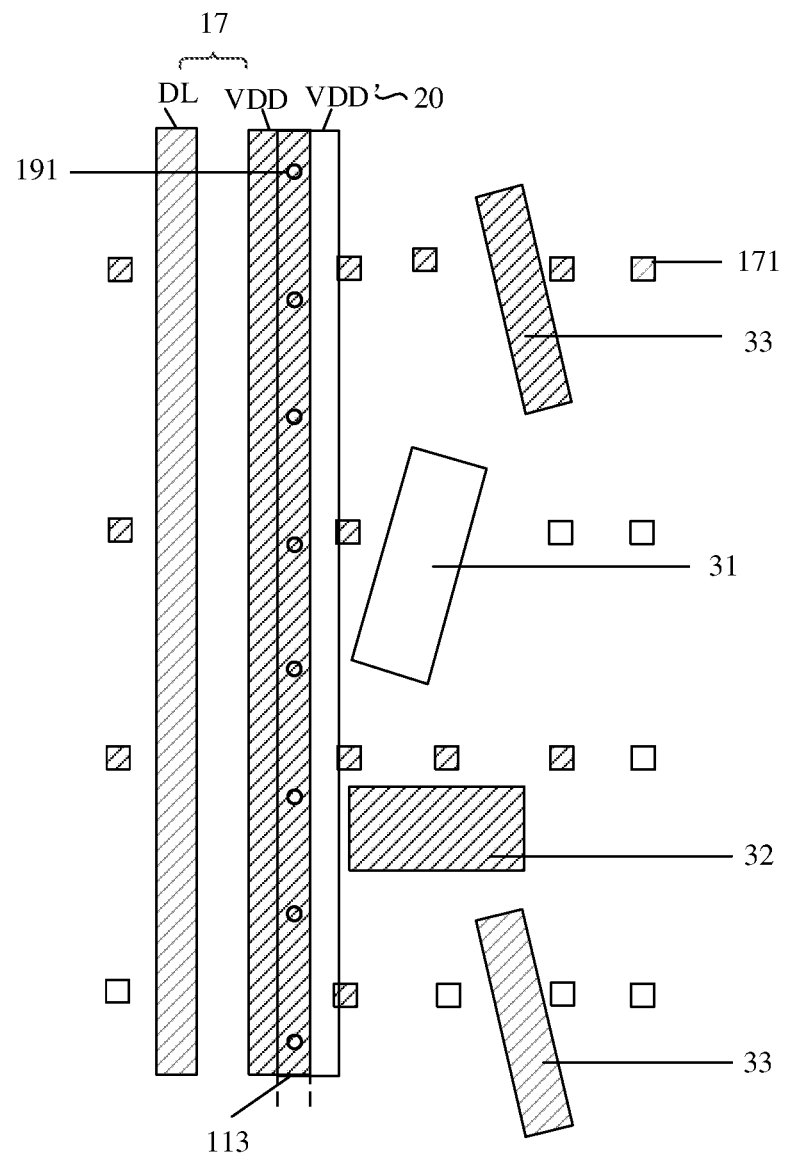
FIG. 14 is a diagram showing structures of a third conductive layer and a fourth conductive layer, in accordance with some embodiments of the present disclosure.

Referring to FIGS. 13 and 14, the driving backplane 1 further includes a fourth conductive layer 20 and a third insulating layer disposed between the third conductive layer 17 and the fourth conductive layer 20. The fourth conductive layer 20 includes at least one auxiliary power supply voltage line VDD' (e.g., a plurality of auxiliary power supply voltage lines VDD'), and the auxiliary power supply voltage line VDD' is coupled to a respective power supply voltage line VDD. It will be understood that connecting the power supply voltage line VDD and the auxiliary power supply voltage line VDD' in parallel may reduce a resistance of each power supply voltage line VDD in the third conductive layer 17. In a case where the power supply voltage does not change, the smaller the resistance of the power supply voltage line VDD is, the larger a current used for driving the light-emitting device L is, and correspondingly, the better a light-emitting effect of the light-emitting device L is.

For example, there is no limitation on an arrangement of the plurality of auxiliary power supply voltage lines VDD' in the fourth conductive layer. An extending direction of the plurality of auxiliary power supply voltage lines VDD' may be the same as or different from an extending direction of the power supply voltage lines VDD in the third conductive layer 17. Or, an extending direction of a part of the plurality of auxiliary power supply voltage lines VDD' is the same as an extending direction of the power supply voltage lines VDD, and an extending direction of the remaining parts is different from the extending direction of the power supply voltage lines VDD. For example, a part of the auxiliary power supply voltage lines VDD' extend in the first direction (e.g., in the X direction), and the other parts of the auxiliary power supply voltage lines VDD' extend in the second direction (e.g., in the Y direction). There is a gap between the auxiliary power supply voltage lines VDD' that extend in the same direction. The power supply voltage lines VDD' that extend in different directions are coupled to each other in a grid shape.

For a manner of coupling the auxiliary power supply voltage line VDD' and the power supply voltage line VDD, reference may be made to the above manner of coupling the first signal line 131 and the second signal line 141. For example, the power supply voltage line VDD is equivalent to the first signal line 131, the auxiliary power supply voltage line VDD' is equivalent to the second signal line 141, and the power supply voltage line VDD is coupled to the auxiliary power supply voltage line VDD'. For another example, the extending direction of the auxiliary power supply voltage line VDD' is the same as the extending direction of the power supply voltage line VDD. An orthogonal projection of the auxiliary power supply voltage line VDD' on the base 11 and an orthogonal projection of the power supply voltage line VDD in the third conductive layer 17 on the base 11 have a third overlapping region 113. The third insulating layer has at least one third via hole 191 (e.g., a plurality of third via holes 191), an orthogonal projection of each third via hole 191 on the base 11 is at least partially overlapped with the third overlapping region 113, and the auxiliary power supply voltage line VDD' in the fourth conductive layer is coupled to the power supply voltage line VDD in the third conductive layer 17 through the third via hole 191, so as to realize the connection in parallel.

In some embodiments of the present disclosure, referring to FIGS. 6 and 13, the third conductive layer 17 further includes at least one fourth conductive pattern 32 (e.g., one fourth conductive pattern 32). The fourth conductive pattern 32 is coupled to a second electrode portion 422e in the active layer of the fourth transistor. For example, the fourth conductive pattern 32 is in contact with the second electrode portion 422e in the active layer of the fourth transistor through a via hole 51f in the film layers (e.g., including the interlayer dielectric layers and the gate insulating layer) sandwiched therebetween. The fourth conductive pattern 32 is used to be coupled to the light-emitting device L. For example, the fourth conductive pattern 32 is coupled to an electrode (the anode or the cathode) of the light-emitting device L, so that the fourth transistor is coupled to the light-emitting device L. For example, a passivation layer (PVX) is provided on a side of the third conductive layer 17 away from the base. For example, the passivation layer may be made of organic materials including polyimide. The electrode (the anode or the cathode) of the light-emitting device L is in contact with the fourth conductive pattern 32 through a via hole 61 provided in the passivation layer (the light-emitting device L is not shown in FIG. 6).

In some embodiments, referring to FIGS. 6, 12 and 13, the plurality of transistors in the pixel circuit 210 include a fifth transistor M5 and a sixth transistor M6. Portions, orthogonal projections of which overlapp with an orthogonal projection of the reset signal line Reset in the first conductive layer 13 on the base 11, of the active pattern layer 40 serve as channel portions 411f1 and 411f2 in an active layer ACTf of the fifth transistor. A portion, an orthogonal projection of which overlaps with an orthogonal projection of the reset signal line Reset' in the first conductive layer 13 on the base 11, of the active pattern layer 40 serves as a channel portion 411g in an active layer ACTg of the sixth transistor. For example, portions, corresponding to the channel portions 411f1 and 411f2 in the active layer of the fifth transistor, of the reset signal line Reset may serve as control electrodes 251f1 and 251f2 of the fifth transistor. That is, the fifth transistor has a dual-gate structure, which may avoid generation of leakage current. A portion, corresponding to the channel portion 411g in the active layer of the sixth transistor, of the reset signal line Reset' may serve as a control electrode 251g of the sixth transistor. A second electrode portion 422f in the active layer ACTf of the fifth transistor is connected to the first electrode portion 421c in the active layer ACTc of the second transistor. That is, the second electrode portion 422f in the active layer ACTf of the fifth transistor is coupled to the third conductive pattern 31 and also coupled to the first electrode plate 43. That is, the second electrode rportion 422f in the active layer ACTf of the fifth transistor is coupled to the control electrode 251a of the driving transistor. A second electrode portion 422g in the active layer ACTg of the sixth transistor is connected to the second electrode portion 422e in the active layer ACTe of the fourth transistor. That is, the second electrode portion 422g in the active layer ACTg of the sixth transistor is coupled to the fourth conductive pattern 32. For example, the second electrode portion 422g in the active layer ACTg of the sixth transistor is coupled to the light-emitting device L.

For example, the third conductive layer 17 further includes at least one fifth conductive pattern 33 (e.g., a plurality of fifth conductive patterns 33). The fifth conductive pattern 33 is coupled to an initialization signal line Init, and the fifth conductive pattern 33 is also coupled to a first electrode portion 421g in the active layer of the sixth transistor. The fifth conductive pattern 33 is in contact with the initialization signal line Init through a via hole 51g in the film layer (e.g., including an interlayer dielectric layer) sandwiched therebetween. The fifth conductive pattern 33 is connected to the first electrode portion 421g in the active layer of the sixth transistor through a via hole 51h in the film layers (e.g., including the interlayer dielectric layers and the gate insulating layer) sandwiched therebetween. It will be understood that shapes and extending directions of the third conductive pattern 31, the fourth conductive pattern 32 and the fifth conductive pattern 33 are not limited as long as electrical connection of corresponding structures may be achieved through a corresponding via hole.

For example, the reset signal lines Reset and Reset' may transmit the same signal, and a row of pixel circuits may be coupled to one reset signal line. That is, the fifth transistor and the sixth transistor are simultaneously turned on, so that the driving transistor and the light-emitting device are reset in the same period.

For another example, the reset signal lines Reset and Reset' may transmit different signals, and a row of pixel circuits may be coupled to two reset signal lines Reset and Reset'. For example, a reset signal line Reset coupled to the fifth transistors in a row of pixel circuits transmits the same signal as a gate line GL coupled to a previous row of pixel circuits of the row of pixel circuits, and a reset signal line Reset' coupled to the sixth transistors in the row of pixel circuits transmits the same signal as a gate line GL coupled to the row of pixel circuits. In this case, a reset signal line coupled to a row of pixel circuits is further used as a gate line GL coupled to a previous row of pixel circuits of the row of pixel circuits, and the other reset signal line coupled to the row of pixel circuits may be further used as a gate line GL coupled to the row of pixel circuits.

In this case, in response to a reset signal from the reset signal line to which a fifth transistor in a row of pixel circuits is coupled, the fifth transistor is turned on to transmit an initialization signal from the initialization signal line Init to the control electrode of the driving transistor, so as to reset the driving transistor. Meanwhile, in response to a gate driving signal from a gate line GL to which a first transistor and a second transistor in a previous row of pixel circuits of the row of pixel circuits are coupled, the first transistor and the second transistor are turned on, a data signal is written, and a threshold voltage of the driving transistor and the data signal are written to the control electrode of the driving transistor. In response to a reset signal from the reset signal line to which the sixth transistor in the row of pixel circuits is coupled, the sixth transistor is turned on to reset the light-emitting device. Meanwhile, in response to a gate driving signal from a gate line GL to which the first transistor and the second transistor in the row of pixel circuits are coupled, the first transistor and the second transistor are turned on, the data signal is written, and the threshold voltage of the driving transistor and the data signal are written to the control electrode of the driving transistor.

For example, a material of the active layers of transistors in the active pattern layer includes amorphous silicon, polycrystalline silicon, or an organic semiconductor material. Structures in the first conductive layer 13 (e.g., including the gate line, the light-emitting control signal line, the reset signal line), structures in the second conductive layer 14 (e.g., including the second electrode, the initialization signal line), and structure in the third conductive layer 17 (e.g., including the first conductive pattern) may have a single-layer or multi-stack layer structure. A material of the single-layer or multi-stack layer structure includes at least one of metals such as aluminum (Al), silver (Ag), magnesium (Mg), molybdenum (Mo), titanium (Ti) and copper (Cu).

In some other embodiments, the display panel may also be a LCD panel. In this case, the driving backplane 1 may be an array substrate. The display panel may further include an opposite substrate disposed opposite to the driving backplane 1, and a liquid crystal layer provided between the array substrate and the opposite substrate. For example, a gate line in the array substrate serves as a first signal line, and a second signal line that constitutes a signal line pair with the first signal line is provided with reference to the above solution.

Figure 15:
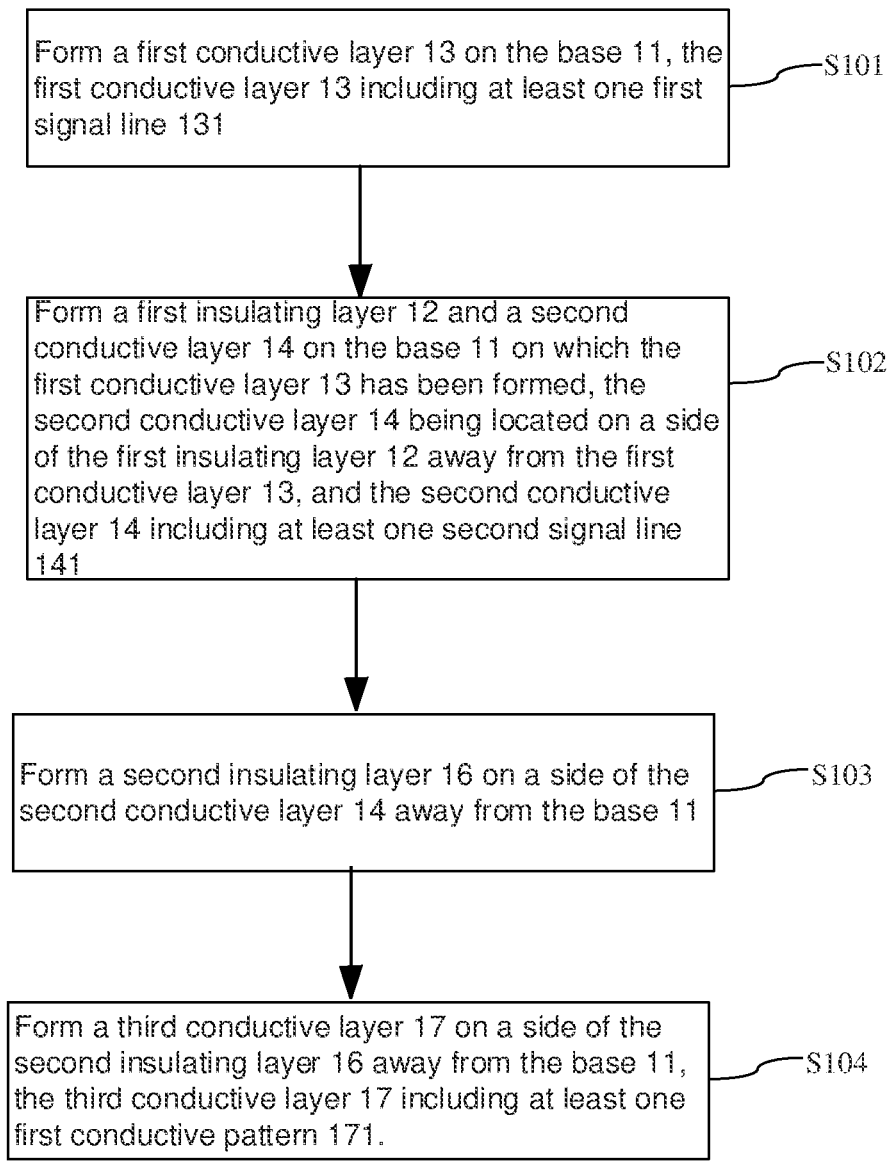
FIG. 15 is a flowchart of manufacturing a driving backplane, in accordance with some embodiments of the present disclosure.

In another aspect, referring to FIG. 15, some embodiments of the present disclosure provide a method of manufacturing the driving backplane 1, including S101 to S102.

In S101, a first conductive layer 13 is formed on the base 11, and the first conductive layer 13 includes at least one first signal line 131.

In S102, a first insulating layer 12 and a second conductive layer 14 are formed on the base 11 on which the first conductive layer 13 has been formed. The second conductive layer 14 is located on a side of the first insulating layer 12 away from the first conductive layer 13, and the second conductive layer 14 includes at least one second signal line 141.

Each first signal line 131 and a respective second signal line 141 constitute a signal line pair 15. In the signal line pair 15, an extending direction of the first signal line 131 is the same as an extending direction of the second signal line 141, an orthogonal projection of the first signal line 131 on the base 11 and an orthogonal projection of the second signal line 141 on the base 11 have a first overlapping region 111, and the second signal line 141 is coupled to the first signal line 131.

Some embodiments of the present disclosure provide a method of manufacturing the driving backplane 1, referring to FIG. 15, the method includes: forming the first conductive layer 13, the first insulating layer 12, the second conductive layer 14, a second insulating layer and a third conductive layer 17 in sequence on the base 11. Steps of forming the second insulating layer and the third conductive layer 17 includes S103 to S104.

In S103, the second insulating layer 16 is formed on a side of the second conductive layer 14 away from the base 11.

In S104, the third conductive layer 17 is formed on a side of the second insulating layer 16 away from the base 11, and the third conductive layer 17 includes at least one first conductive pattern 171.

The first insulating layer 12 has at least one first via hole 121, and the second insulating layer 16 has at least one second via hole 161. Each first via hole 121 and a respective second via hole 161 constitute a via hole pair. In the via hole pair 18, the first via hole 121 is communicated with the second via hole 161. A portion of the first signal line exposed by the via hole pair is a first connection portion, and a portion of the second signal line exposed by the second via hole 161 in the via hole pair is a second connection portion. An orthogonal projection of the second connection portion on the base 11 and the first overlapping region 111 have a second overlapping region. A first conductive pattern is in contact with the second connection portion through the second via hole 161, and is in contact with the first connection portion through the via hole pair.

Figure 16:
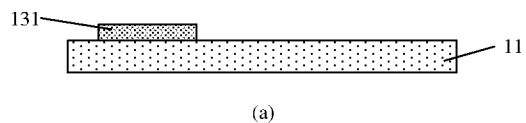
FIG. 16 is a diagram showing a manufacturing process of a driving backplane, in accordance with some embodiments of the present disclosure.
Figure 16:
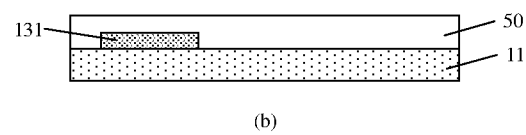
Figure 16:
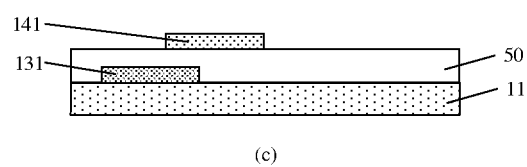
Figure 16:
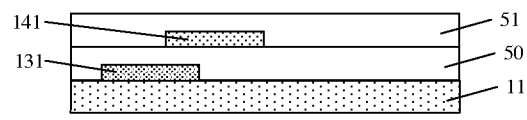
Figure 16:
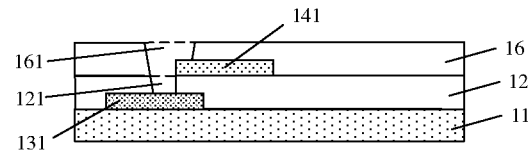
Figure 16:
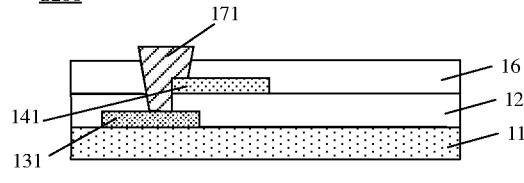
Figure 13:
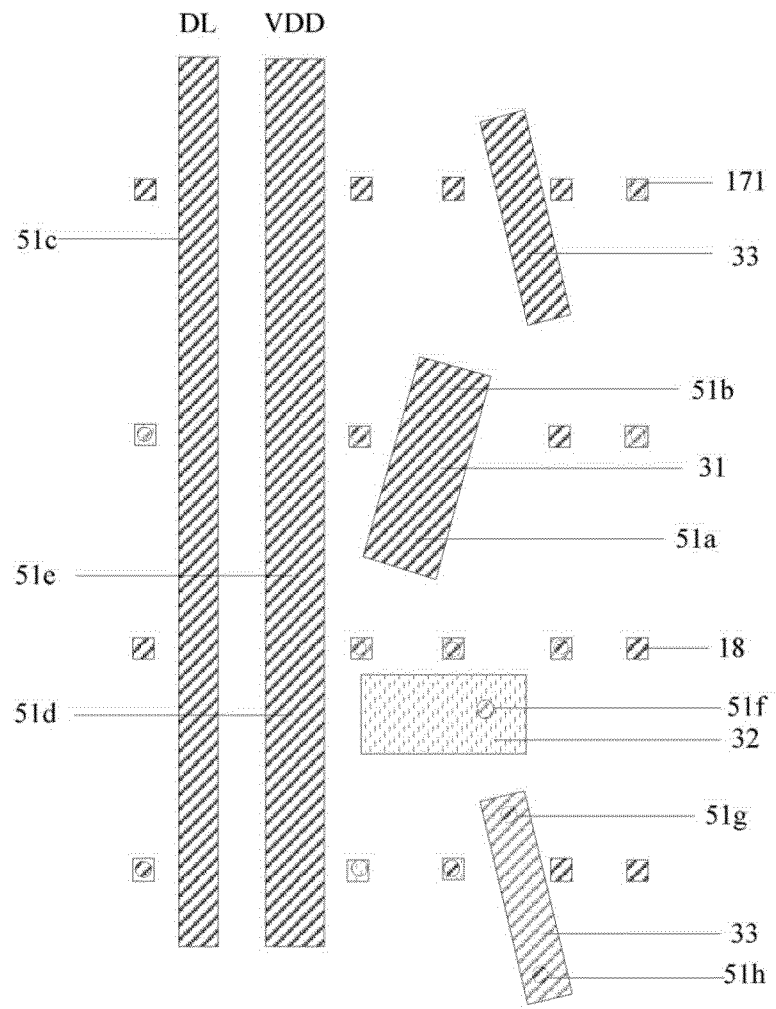
Figure 14:
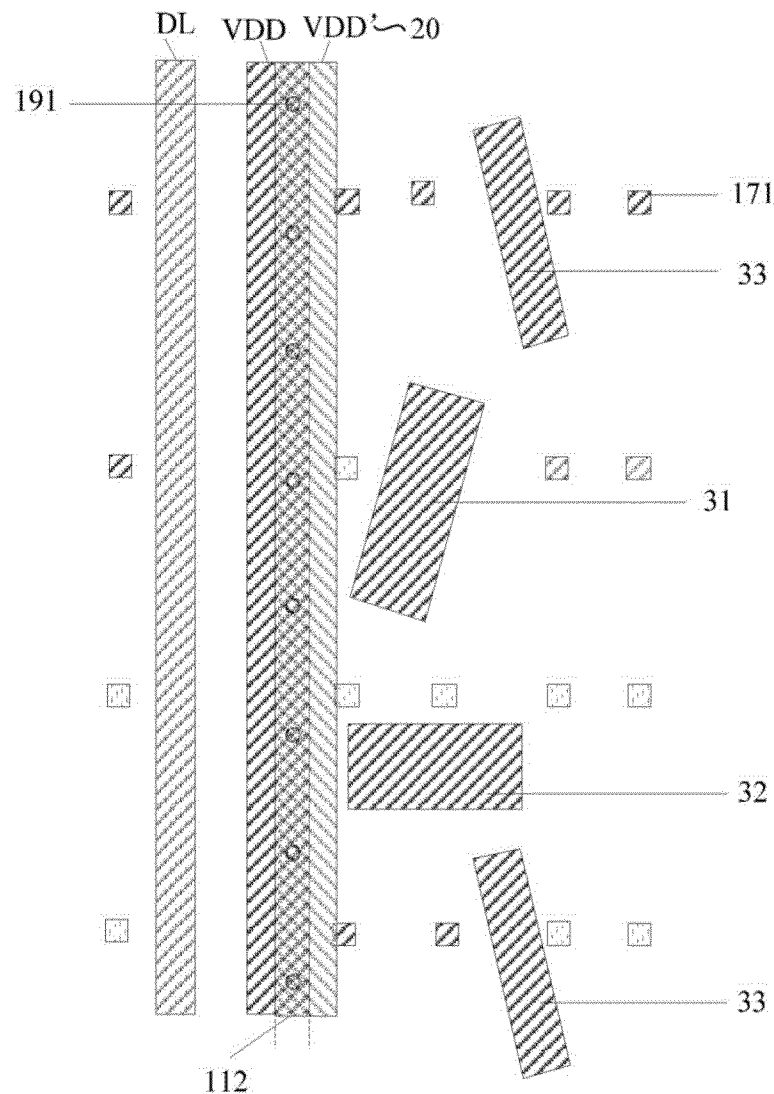

In some embodiments of the present disclosure, as shown in FIG. 16, in the method of manufacturing the driving backplane 1, steps of forming the first conductive layer 13, the first insulating layer 12, the second conductive layer 14 and the second insulating layer 16 includes S201 to S206.

In S201, a first conductive film is formed on the base 11, and the first conductive film is patterned to form the first conductive layer 13 including at least one first signal line 131.

In S202, a first insulating film 50 is formed on the base 11 on which the first conductive layer 13 has been formed.

In S203, a second conductive film is formed on the base 11 on which the first insulating film 50 has been formed, and the second conductive film is patterned to form the second conductive layer 14 including at least one second signal line 141.

In S204, a second insulating film 51 is formed on the base 11 on which the second conductive layer 14 has been formed.

Materials of the first insulating film 50 and the second insulating film 51 may be selected from silicon nitride, silicon oxide, etc.

In S205, the second insulating film 51 and the first insulating film 50 are patterned to form the second insulating layer 16 including the at least one second via hole 161 and the first insulating layer 12 including the at least one first via hole 121.

In S206, a third conductive film is formed on the base 11 on which the second insulating layer 16 has been formed, and the third conductive film is patterned to form the third conductive layer 17 including at least one first conductive pattern 171.

For example, the above method, before forming the first conductive layer 13 on the base 11, may further include: forming an active pattern layer 40 on the base 11.

For materials and shapes of the layers manufactured by the above method, and a positional relationship between the layers, reference may be made to the above embodiments of the driving backplane 1, and the same technical effects as the driving backplane 1 may be produced, which will not be repeated herein.

Finally, it will be noted that above embodiments are merely intended to describe the technical solutions of the present disclosure rather than limit the present disclosure. Although the present disclosure has been described in detail with reference to the foregoing embodiments, it will be understood by those skilled in the art that modifications may still be made to the technical solutions described in the foregoing embodiments, or equivalent replacements may be made to some technical features thereof. These modifications or replacements will not make the essence of the corresponding technical solutions depart from the spirit and scope of the technical solutions in the embodiments of the present disclosure.

What is claimed is:

1. A driving backplane, comprising:
   a base;
   a first conductive layer disposed on the base, the first conductive layer including at least one first signal line;
   a first insulating layer disposed on a side of the first conductive layer away from the base; and
   a second conductive layer disposed on a side of the first insulating layer away from the first conductive layer, the second conductive layer including at least one second signal line, wherein
   each first signal line and a respective one of the at least one second signal line constitute a signal line pair; in the signal line pair, an extending direction of the first signal line is the same as an extending direction of the second signal line, an orthogonal projection of the first signal line on the base and an orthogonal projection of the second signal line on the base have a first overlapping region, and the second signal line is coupled to the first signal line.

2. The driving backplane according to claim 1, further comprising:
   a second insulating layer disposed on a side of the second conductive layer away from the base; and
   a third conductive layer disposed on a side of the second insulating layer away from the base, the third conductive layer including at least one first conductive pattern, wherein
   each first conductive pattern extends through the second insulating layer to be coupled to a second signal line in a respective one of at least one signal line pair, and the first conductive pattern extends through the second insulating layer and the first insulating layer to be coupled to a first signal line in a same signal line pair as the second signal line.

3. The driving backplane according to claim 2, wherein
   the first insulating layer has at least one first via hole, the second insulating layer has at least one second via hole; each first via hole and a respective one of the at least one second via hole constitutes a via hole pair, and the first via hole is communicated with the second via hole in the via hole pair; and
   in the signal line pair, a portion of the first signal line exposed by a corresponding via hole pair is a first connection portion; a portion of the second signal line exposed by a second via hole in the corresponding via hole pair is a second connection portion; an orthogonal projection of the second connection portion on the base and the first overlapping region has a second overlapping region; a first conductive pattern is in contact with the second connection portion through the second via hole in the corresponding via hole pair, and is in contact with the first connection portion through the corresponding via hole pair.

4. The driving backplane according to claim 3, wherein the first via hole has a first opening and a second opening opposite to each other, and the first opening is far away from the base compared to the second opening; the second via hole has a third opening and a fourth opening opposite to each other, and the third opening is far away from the base compared to the fourth opening; and
   in a same via hole pair, a combination of an orthogonal projection of the first opening on the base and an orthogonal projection of the second connection portion exposed by the second via hole on the base substantially coincides with an orthogonal projection of the fourth opening on the base.

5. The driving backplane according to claim 3, wherein an orthogonal projection of the corresponding via hole pair on the base is contained within a border of an orthogonal projection of the signal line pair on the base.

6. The driving backplane according to claim 3, wherein in a same signal line pair, the first signal line is coupled to the second signal line through a plurality of via hole pairs, and the plurality of via hole pairs are arranged in the extending direction of the first signal line.

7. The driving backplane according to claim 3, wherein an orthogonal projection of the via hole pair on the base is completely located within an orthogonal projection of the first conductive pattern on the base.

8. The driving backplane according to claim 7, wherein a minimum distance between an edge of the orthogonal projection of the first conductive pattern on the base and an edge of the orthogonal projection of the via hole pair on the base is greater than or equal to one sixth of a width of the first signal line.

9. The driving backplane according to claim 1, wherein a ratio of a width of the first overlapping region to a width of the first signal line is in a range of one third to one half in a width direction of the first signal line.

10. The driving backplane according to claim 1, wherein the second conductive layer further includes at least one second conductive pattern; and
in a signal line pair adjacent to a second conductive pattern, the first signal line is closer to the second conductive pattern than the second signal line.

11. The driving backplane according to claim 10, wherein the second conductive layer includes at least two second conductive patterns, and the at least two second conductive patterns include electrode plates and/or initialization signal lines.

12. The driving backplane according to claim 1, wherein a width of the first signal line is equal to a width of the second signal line.

13. The driving backplane according to claim 1, further comprising:
two driving circuits coupled to both ends of the at least one first signal line.

14. The driving backplane according to claim 1, wherein the at least one first signal line includes at least one of a gate line, a light-emitting control signal line and a reset signal line.

15. The driving backplane according to claim 1, further comprising:
an active pattern layer disposed on a side of the first conductive layer proximate to the base, wherein
the active pattern layer includes at least one semiconductor pattern and a plurality of conductorized patterns, and each semiconductor pattern spacing two conductorized patterns in the plurality of conductorized patterns apart.

16. The driving backplane according to claim 2, wherein the third conductive layer further includes:
data lines and power supply voltage lines, an extending direction of the data lines is the same as an extending direction of the power supply voltage lines, and orthogonal projections of the data lines on the base and orthogonal projections of the power supply voltage lines on the base have no overlapping region.

17. A display apparatus, comprising the driving backplane according to claim 1.

18. A method of manufacturing a driving backplane, the method comprising:
forming a first conductive layer on a base, the first conductive layer including at least one first signal line;
forming a first insulating layer and a second conductive layer in sequence on the base on which the first conductive layer has been formed, the second conductive layer including at least one second signal line, wherein
each first signal line and a respective one of the at least one second signal line constitute a signal line pair; in the signal line pair, an extending direction of the first signal line is the same as an extending direction of the second signal line, an orthogonal projection of the first signal line on the base and an orthogonal projection of the second signal line on the base have a first overlapping region, and the second signal line is coupled to the first signal line.

19. The method of manufacturing the driving backplane according to claim 18, further comprising:
forming a second insulating layer on a side of the second conductive layer away from the base;
forming a third conductive layer on a side of the second insulating layer away from the base, the third conductive layer including at least one first conductive pattern, wherein
the first insulating layer has at least one first via hole; the second insulating layer has at least one second via hole; each first via hole and a respective one of the at least one second via hole constitute a via hole pair, and the first via hole is communicated with the second via hole in the via hole pair; and
in the signal line pair, a portion of the first signal line exposed by a corresponding via hole pair is a first connection portion; a portion of the second signal line exposed by a second via hole in the corresponding via hole pair is a second connection portion; an orthogonal projection of the second connection portion on the base and the first overlapping region has a second overlapping region;
a first conductive pattern is in contact with the second connection portion through the second via hole in the corresponding via hole pair, and is in contact with the first connection portion through the corresponding via hole pair.

20. The method according to claim 19, wherein steps of forming the first insulating layer, the second conductive layer and the second insulating layer include:
forming a first insulating film on the base on which the first conductive layer has been formed;
forming the second conductive layer on the base on which the first insulating film has been formed, the second conductive layer including at least one second signal line;
forming a second insulating film on the base on which the second conductive layer has been formed; and
patterning the second insulating film and the first insulating film to form the second insulating layer including the at least one second via hole and the first insulating layer including the at least one first via hole.

* * * * *

UNITED STATES PATENT AND TRADEMARK OFFICE
CERTIFICATE OF CORRECTION

PATENT NO. : 12,057,455 B2
APPLICATION NO. : 17/621176
DATED : August 6, 2024
INVENTOR(S) : Wentao Wang et al.

It is certified that error appears in the above-identified patent and that said Letters Patent is hereby corrected as shown below:

In the Drawings

Please replace drawings for FIG. 13 and FIG. 14 with the attached FIG. 13 and FIG. 14.

Signed and Sealed this
Twelfth Day of November, 2024

Katherine Kelly Vidal
Director of the United States Patent and Trademark Office